US009053976B2

(12) United States Patent
Ernst et al.

(10) Patent No.: US 9,053,976 B2
(45) Date of Patent: Jun. 9, 2015

(54) STRUCTURE AND PRODUCTION PROCESS OF A MICROELECTRONIC 3D MEMORY DEVICE OF FLASH NAND TYPE

(75) Inventors: Thomas Ernst, Morette (FR); Gabriel Molas, Grenoble (FR); Barbara De Salvo, Montbonnot (FR); Stephane Becu, Bethune (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 976 days.

(21) Appl. No.: 13/003,111

(22) PCT Filed: Jul. 10, 2009

(86) PCT No.: PCT/EP2009/058870
§ 371 (c)(1),
(2), (4) Date: Mar. 30, 2011

(87) PCT Pub. No.: WO2010/004047
PCT Pub. Date: Jan. 14, 2010

(65) Prior Publication Data
US 2011/0169067 A1     Jul. 14, 2011

(30) Foreign Application Priority Data

Jul. 10, 2008     (FR) ..................................... 08 54729

(51) Int. Cl.
*H01L 29/80*     (2006.01)
*H01L 27/115*     (2006.01)
(Continued)

(52) U.S. Cl.
CPC .......... *H01L 27/115* (2013.01); *H01L 21/8221* (2013.01); *H01L 27/0688* (2013.01);
(Continued)

(58) Field of Classification Search
CPC ............ H01L 21/8221; H01L 27/0688; H01L 27/11514; H01L 27/11529; H01L 27/11551; H01L 27/11578
USPC .................... 257/67, 278, 296, 300, 302, 390
See application file for complete search history.

(56) References Cited

U.S. PATENT DOCUMENTS 6,933,556 B2 *  8/2005  Endoh et al. ................. 257/315
2007/0252201 A1  11/2007  Kito et al.
(Continued)

FOREIGN PATENT DOCUMENTS

JP     2006-155750 A     6/2006
JP     2006155750 A *     6/2006
(Continued)

OTHER PUBLICATIONS

Yoshiaki Fukuzumi, et al., "Optimal Integration and Characteristics of Vertical Array Devices for Ultra-High Density, Bit-Cost Scalable Flash Memory", IEDM 2007 Tech. Dig., 2007, XP 008101292, pp. 449-452.
(Continued)

*Primary Examiner* — Matthew E Warren
(74) *Attorney, Agent, or Firm* — Oblon, McClelland, Maier & Neustadt, L.L.P.

(57) ABSTRACT

A microelectronic flash memory device including a plurality of memory cells including transistors fitted with a matrix of channels connecting a block of common source to a second block on which bit lines rest, the transistors also being formed by a plurality of gates including at least one gate material, including a first selection gate coating the channels, a plurality of control gates coating the channels, a plurality of second selection gates each coating the channels of the same row and the matricial arrangement, at least one or more of the gates based on superposition of layers including at least one first layer of dielectrical material, at least one charge store zone, and at least one second layer of dielectrical material.

6 Claims, 25 Drawing Sheets

(51) Int. Cl.
  *H01L 21/822* (2006.01)
  *H01L 27/06* (2006.01)
  *H01L 27/12* (2006.01)

(52) U.S. Cl.
  CPC .... *H01L27/11568* (2013.01); *H01L 27/11578* (2013.01); *H01L 27/11582* (2013.01); *H01L 27/1203* (2013.01)

(56) References Cited

U.S. PATENT DOCUMENTS

| | | |
|---|---|---|
| 2008/0007635 A1 | 1/2008 | Hsu et al. |
| 2008/0073635 A1 | 3/2008 | Kiyotoshi et al. |
| 2008/0099819 A1 | 5/2008 | Kito et al. |
| 2008/0149913 A1 | 6/2008 | Tanaka et al. |
| 2008/0277691 A1 | 11/2008 | Ernst et al. |

FOREIGN PATENT DOCUMENTS

| | | |
|---|---|---|
| JP | 2008-78404 A | 4/2008 |
| JP | 2008-103429 A | 5/2008 |

OTHER PUBLICATIONS

H. Tanaka, et al., "Bit Cost Scalable Technology with Punch and Plug Process for Ultra High Density Flash Memory", VLSI Technology, 2007 IEEE Symposium On, PI, XP 031139616, Jun. 1, 2007, 1 page.

Soon-Moon, Jung, et al., "Three Dimensionally Stacked NAND Flash Memory Technology Using Stacking Single Crystal Si Layers on ILD and TANOS Structure for Beyond 30nm Node", IEDM 2006, International, IEEE, PI, XP031078315, Dec. 1, 2006, 4 pages.

Search Report issued Jan. 30, 2009 in French Patent Application No. FR 0854729 (with English Translation of Category of Cited Documents).

U.S. Appl. No. 13/308,886, filed Dec. 1, 2011, Gely et al.

Office Action issued Nov. 19, 2013 in Japanese Patent Application No. 2011-517175 (with English language translation).

\* cited by examiner

STRUCTURE AND PRODUCTION PROCESS OF A MICROELECTRONIC 3D MEMORY DEVICE OF FLASH NAND TYPE

TECHNICAL FIELD

The present invention relates to the field of microelectronics, and more particularly to that of memories, and its aim is to provide rewritable 3D memory, in particular non-volatile memory of Flash type, such as NAND memory, comprising memory points or cells distributed in 3 dimensions, formed by means of at least one structure comprising several gates formed about bars based on parallel semi-conductor material connecting semi-conductor blocks, the gates based on superposition of layers comprising at least one charge storage zone.

The present invention also relates to a production process of such memory.

PRIOR ART

Continuing efforts are being made to increase the density of memories. For this, an attempt is made to make cells increasingly smaller in size. For memory technologies in which the gate lengths are less than 30 nm, memory performance is limited due to insufficient insulation of memory points from one another, and the effects of short channels.

Also, lithographic processes for critical dimensions below 30 nanometers present difficulties in execution. The latter can boost production costs significantly.

To improve integration density, 3D memories in which the memory points are distributed in 3 dimensions have now appeared. Such memories can be made for example by a stack of several chips. The advantage in terms of cost gain and of executing such a device is low or zero, to the extent where making such memories involves no reduction in the number of technological steps.

It is also possible to make several levels of memories stacked on the same substrate. In this case, an additional semi-conductor layer which can be based on polysilicon, or amorphous silicon recrystallised by thermal annealing on is placed on a memory level already made. Another memory level is thus made on this additional semi-conductor layer.

The document by S.-M. Jung et al.: "Three-Dimensionally Stacked NAND Flash Memory Technology Using Stacking Single-Crystal Si Layers on ILD and TANOS Structure for Beyond 30 nm Node", *IEDM Tech. Dig.*, pp 37-40, 2006, presents flash NAND memory comprising transistors made on two levels N1 and N2, each level being formed by an active semi-conductor layer 1, 2, in which the channels of the transistors are made. The active layers 1 and 2 are separated from one another by an insulation layer 3.

Contacts 4, 5 passing through the insulation layer 3 can be provided to interconnect one transistor or transistors made on the first layer active 1 and one transistor or transistors made on the second active layer 2 (FIG. 1).

Such a device produces double memory density without actually doubling the size of the chip.

However, due to the production process of the second active semi-conductor layer 2, the channels of the transistors of the second level $N_2$ are potentially of lesser crystalline quality than those of the transistors of the first level $N_1$. Also, the production process of such a device has a high cost to the extent where a large number of photolithography steps is required.

The document by H. Tanaka et al., "Bit-Cost Scalable Technology with Punch and Plug Process for Ultra High Density Flash Memory", VLSI Tech Dig, p. 14-15, 2007, and the one by: Y. Fukuzumi et al., "Optimal Integration and Characteristics of Vertical Array Devices for Ultra-High Density, Bit-Cost Scalable Flash Memory", IEDM 2007 Tech Dig, p. 449-452, present a memory device with vertical channels, orthogonal relative to the substrate.

Making such a device requires a limited number of photolithography steps relative to that described previously in conjunction with FIG. 1. Such a device also produces high integration density due to three-dimensional matricial arrangement of bit lines and word lines.

In such a device (FIG. 2), the channels of the transistors are perpendicular to a substrate 10, especially by depositing amorphous or polycrystalline silicon, reducing the electrical performance of the cell memory relative to a device equipped with channels made of monocrystalline semi-conductor material.

The production process of such a device requires the dielectrical gate tunnel to be made by depositing, which lessens its quality below that of a gate tunnel dielectrical obtained via thermal oxidation. Also, additional technological steps likely to degrade the previously deposited dielectrical gate tunnel have to be taken to make good-quality electrical contact between the common source and the channel of such a device.

Document US 2008/007 635 A1 discloses 3D memory according to the prior art, and in particular a flash NAND memory device with double-gate transistors.

The problem arises of finding a novel 3D memory structure, for which the problems of bulk on a substrate in a direction parallel to the latter substrate are further reduced, while integration in a vertical direction and electrical performance are improved.

EXPLANATION OF THE INVENTION

In response especially to the aims presented above, the invention first proposes a microelectronic flash memory device comprising:
  a substrate,
  a plurality of memory cells comprising transistors made in a stack of layers based on said substrate including a plurality of semi-conductor layers, the stack comprising at least one first block of common source region of said transistors, and at least one second block on which, or from which, a plurality of lines of bits parallel to the principal plane of the substrate is made,
  a plurality of other blocks parallel to each other and to the principal plane of the substrate connecting the first block and the second block, said other blocks comprising several distinct channels of transistors, said channels being distributed according to a matricial arrangement of horizontal rows and vertical rows of channels,
  a plurality of gates formed from at least one gate material,
  at least one or more of said gates based on a superposition of layers comprising at least one first layer of dielectrical material, at least one charge storage zone, and at least one second layer of dielectrical material.
The gates can comprise:
  a first selection gate coating all said channels,
  a plurality of control gates coating all said channels,
  a plurality of second selection gates each coating, of the plurality of bars, only the channels of the same vertical row of channels of the matricial arrangement.

According to a first possible execution, said stack can be formed by alternating layers based on a first semi-conductor material, and layers based on a second semi-conductor material, different to the first semi-conductor material, said transistor channels being formed in said first semi-conductor material.

The first semi-conductor material and the second semi-conductor material can be monocrystalline materials.

According to a possible execution, the first layer of dielectrical material can be formed by oxidation of said semi-conductor layers.

This guarantees good quality of the gate tunnel dielectrical and good interface quality between the channels and the dielectrical tunnel relative to a deposited oxide.

The first layer of dielectrical material can be formed after the channels of the transistors are made, which can avoid exposing this dielectrical to chemical treatment, which risks degrading it.

According to a second possible execution of the device, said stack can be formed by alternating layers based on a given semi-conductor material, and layers based on insulation material, said channels being formed in said given semi-conductor material.

According to a third possibility, said stack can be advantageously formed by alternating layers based on semi-conductor material according to a given dose, and layers based on said non-doped semi-conductor material, or doped according to another dose, different to said given dose.

In this case, the semi-conductor material can be Si.

In a vertical direction, that is, a direction orthogonal to the substrate, such a stack uses a greater number of channels than in a stack containing different semi-conductor materials, for example a stack of Si and SiGe.

The number of layers of a stack of Si and SiGe is limited due to mechanical constraints between the layers of Si and SiGe.

The charge storage zone can be based on dielectrical material such as $Si_xN_y$, or another dielectrical material comprising similar trapping properties of charges.

According to a possible execution, the charge storage zone can also be formed from semi-conductor or metallic islets encapsulated in a layer of dielectrical material.

Such islets can be for example based on Si, Ge, SiGe, Pt, W, Co, Ni, Au, and can be encapsulated for example in a dielectrical layer based on $Si_xO_y$, or $Si_xN_y$.

The charge storage zone can have a thickness for example between 1 nm and 15 nm.

The second block can comprise a stepped profile with a plurality of steps respectively forming contact zones of bit lines.

The present invention also relates to a production process of a microelectronic flash memory device comprising the steps of:
a) formation on a substrate of a stack of layers comprising a plurality of semi-conductor layers,
b) etching of the stack to form at least one first block in which a common source region is to be made, and at least one second block, as well as a plurality of distinct juxtaposed blocks connecting the first block and the second block, said distinct blocks comprising respectively several bars intended to form transistor channels, the bars being parallel to each other and to the principal plane of the substrate, said channels being distributed according to a matricial arrangement of horizontal rows and vertical rows of channels,
c) making zones formed from superposition of layers comprising at least one first layer of dielectrical gate material, at least one charge storage zone, and at least one second layer of dielectrical gate material,
d) forming gates, at least several of said gates based respectively on said zones.

The gates can comprise:
a first selection gate coating said channels,
a plurality of control gates coating said channels,
a plurality of second selection gates each coating, among the plurality of bars, only the channels of the same row of channels of the matricial arrangement.

According to a first possibility, said stack can be formed by alternating layers based on a first semi-conductor material, and by layers based on a second semi-conductor material, different to the first semi-conductor material, the channels being formed or designed to be formed in the first semi-conductor material.

According to the first possibility, the process can comprise between the step b) and the step c):
selective etching of the second semi-conductor material vis-à-vis the first semi-conductor material to reduce the surface of the layers based on the second semi-conductor material,
forming insulation spacers about the layers based on the second semi-conductor material.

An overhang of layers in which the channels are made relative to the other layers of the stack can be created by way of the selective etching step.

The microelectronic process can also comprise, after step d): surface doping of the layers of the stack based on the first semi-conductor material.

According to a second possibility, the stack can be formed by alternating first layers based on a semi-conductor material doped according to a given dose, and second layers based on said semi-conductor material not doped or doped according to another dose, less than said given dose.

Such a stack can comprise in a vertical direction, that is, a direction orthogonal to the substrate, a substantial number of channels, and in particular more substantial than with a stack of different semi-conductor materials.

In this case, the microelectronic process can comprise after step b): preferred oxidation of said first layers vis-à-vis said second layers to form insulation material separating said second layers from each other in the stack, with the exception of at least one region of the first block in which part of the first semi-conductor layers and second semi-conductor layers is not oxidised.

A common source region can be made in the first block.

For this, the dimensions of the source region in the directions parallel to the plane of the substrate can be provided as being greater than twice the maximal length of removal of the semi-conductor material etched selectively.

The process can also comprise, after step b), forming a common source by:
forming masking on the second block and said other blocks, said masking revealing said first block,
doping the semi-conductor layers of said first block.

According to a third possible execution of the process, the stack can be formed by alternating layers based on semi-conductor material, and layers based on insulation material.

The process can comprise making a common source in said first block, the making of this common source comprising steps of:
formation of at least one hole in said first block of the stack through masking,
filling of said hole by means of at least one conductor or semi-conductor material.

The process can comprise making a common source in said first block, the making of this common source comprising steps of:
forming masking on the second block and said other blocks, said masking revealing said first block, doping the semi-conductor layers of said first block.

The process can also comprise: making at least one stepped profile at the level of the second block, said stepped profile comprising a plurality of steps, at least one or more of said steps being provided to form contacting zones of bit lines.

BRIEF DESCRIPTION OF DIAGRAMS

The present invention will be better understood from the description of given embodiments, purely by way of indication and non-limiting, in reference to the attached diagrams, in which:

FIG. 1 illustrates a first example of a device of flash NAND memory according to the prior art, FIG. 2 illustrates a second example of 3D NAND flash memory device according to the prior art, comprising transistors whereof the channel is orthogonal to the substrate, FIG. 3 illustrates an example of a three-dimensional NAND flash memory structure, according to the invention, FIGS. 4A and 4B illustrate an example of a device according to the invention, of three-dimensional flash NAND memory formed in a stack of semi-conductor layers, FIG. 5 illustrates another example of a three-dimensional NAND flash memory device, formed in a stack of layers comprising alternating semi-conductor layers and insulation layers, FIGS. 6A-6D, 7A-7O, 8A-8E illustrate a first example of a production process according to the invention of a three-dimensional microelectronic flash NAND memory device, FIGS. 9A, 10A-10D, 11A-11C illustrate a second example of a production process according to the invention of a three-dimensional microelectronic flash NAND memory device, FIGS. 12A-12C, 13A illustrate a third example of a production process according to the invention of a three-dimensional microelectronic flash NAND memory device, FIG. 14 illustrates another example of a three-dimensional NAND flash memory device, each channel of which is controlled by two independent control gates, FIG. 15 illustrates an example of an equivalent electrical scheme of a three-dimensional NAND flash memory device, according to the invention.

Identical, similar or equivalent parts of the different figures bear the same reference numerals to make it easy to go from one figure to the other.

The different parts illustrated in the figures are not necessarily according to a uniform scale to make the figures more legible.

DETAILED EXPLANATION OF PARTICULAR EMBODIMENTS

An example of a device microelectronic of memory three-dimensional will now be described in conjunction with FIG. 3.

This memory can comprise m*n*p memory points or memory cells and can be of Flash type, that is, rewritable semi-conductor memory having the characteristics of live memory, but whereof the data do not vanish when turned off.

So, the flash memory stores one bit or bits of data in memory cells, these data being kept in memory when the power supply of the memory is cut.

The memory can have architecture similar to that of flash memory of NAND type.

FLASH memories of NAND type are accessible by block and offer very strong density of memory points per surface unit to the extent where they need few interconnections.

The device first comprises a substrate 100 which can be of semi-conductor on insulator type, for example of SOI (SOI for "Silicon On Insulator") type or can be a solid semi-conductor substrate ("bulk").

The substrate 100 acts as substrate to a first semi-conductor block 110 forming a common source having several transistors.

Semi-conductor bars 120 parallel to the principal plane of the substrate (the principal plane of the substrate being defined in FIG. 3 as a plane passing through the substrate 100 and parallel to the plane $[O; \vec{i}; \vec{j}]$ of an orthogonal marker $[O; \vec{i}; \vec{j}; \vec{k}]$) connect each block of common source 110 in the direction of their length to a contact zone connected to a conductive line called a bit line.

These semi-conductor bars 120 are designed to form channels of said transistors. The semi-conductor bars 120 designed to form channels of said transistors can be separated from each other by other bars (not shown in FIG. 3), these other bars being insulating or based on different semi-conductor material, or based on the same material but having weaker doping or not being doped.

The semi-conductor bars 120 can be arranged according to a matrix, comprising p (with p≥1) vertical rows of bars parallel to each other and m (with m≥1) horizontal rows of bars parallel to each other.

The term "vertical" means an orthogonal direction or a direction substantially orthogonal to the principal plane of the substrate, while "horizontal" means a parallel direction or a direction substantially parallel to the principal plane of the substrate.

The length Lb of the bars 120 can be provided such that Lb=(n+3)*dg+(n+2)*Lg, with n a number of control gates, dg being the spacing between two adjoining gates and Lg being the length of a gate (defined in a direction parallel to the vector $\vec{i}$ of the orthogonal marker $[O; \vec{i}; \vec{j}; \vec{k}]$). The spacing dg and the length Lg can be for example between 5 nanometers and 500 nanometers, or be for example of the order of 50 nanometers.

The bars can be spaced apart at a distance db, for example between 5 and 500 nanometers, for example of the order of 100 nanometers.

The bars 120 of the same horizontal row of the matrix can be connected to the same bit line.

In this example, the device comprises a number p of conductive bit lines $130_1, \ldots, 130_p$.

The device also comprises a first selection gate 140 in the form of a block which, in this example, coats all the bars 120 and controls conduction of the latter.

The device can also comprise a plurality of n control gates $150_1, \ldots, 150_n$, respectively in the form of a block of gate material which coats each of the bars 120 of the structure.

At the level of each of the control gates a layer of dielectrical gate (not shown in this figure) is in contact with the bars 120. A charge storage zone (not shown in this figure), for example load storage, is also provided and rests on the layer of gate dielectrical. Another dielectrical layer is provided between the gate material and said charge storage zone.

The device comprises a plurality of second selection gates.

In this example, the device comprises m second selection gates $160_1, \ldots 160_m$, respectively in the form of a block which coats each of the bars 120 of the same vertical row of the matrix of bars.

The material of the gates 140, $150_1, \ldots, 150_n$, $160_1, \ldots, 160_m$, can be semi-conductor such as for example polysilicon, or metallic such as for example TiN, W, polysilicon silicide, TaN, Pt, PtSi or a combination of these materials.

FIG. 4A shows a plan view of the device, while FIG. 4B shows this device according to a transversal section.

Figure 1:
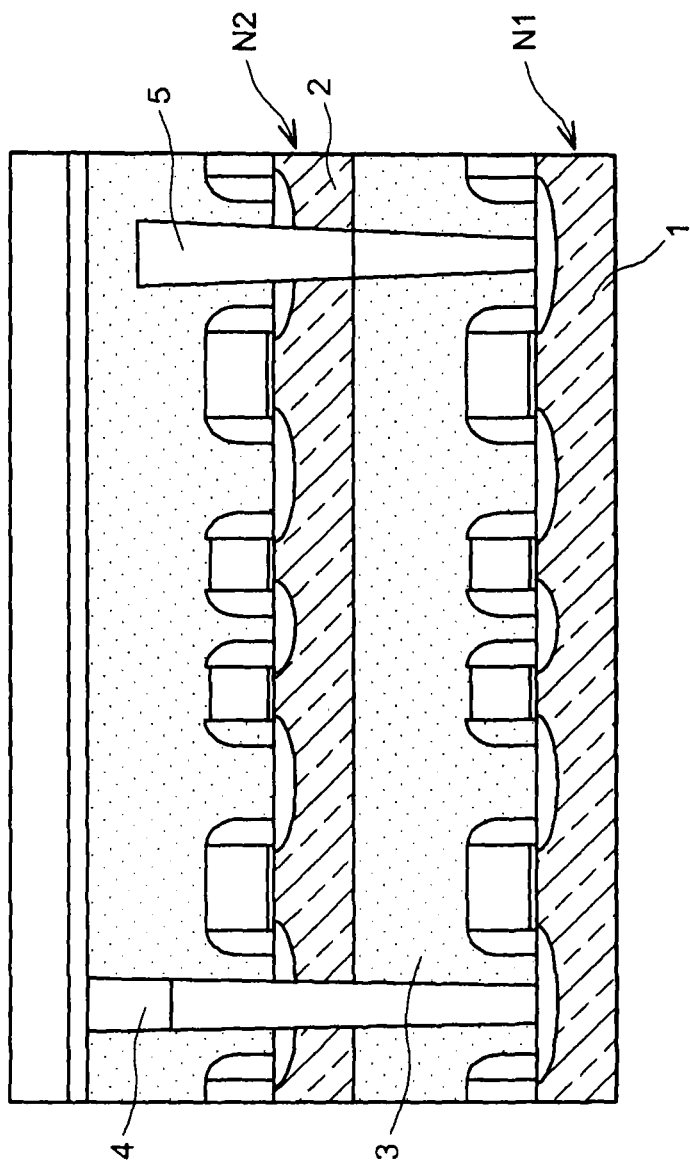
Figure 2:
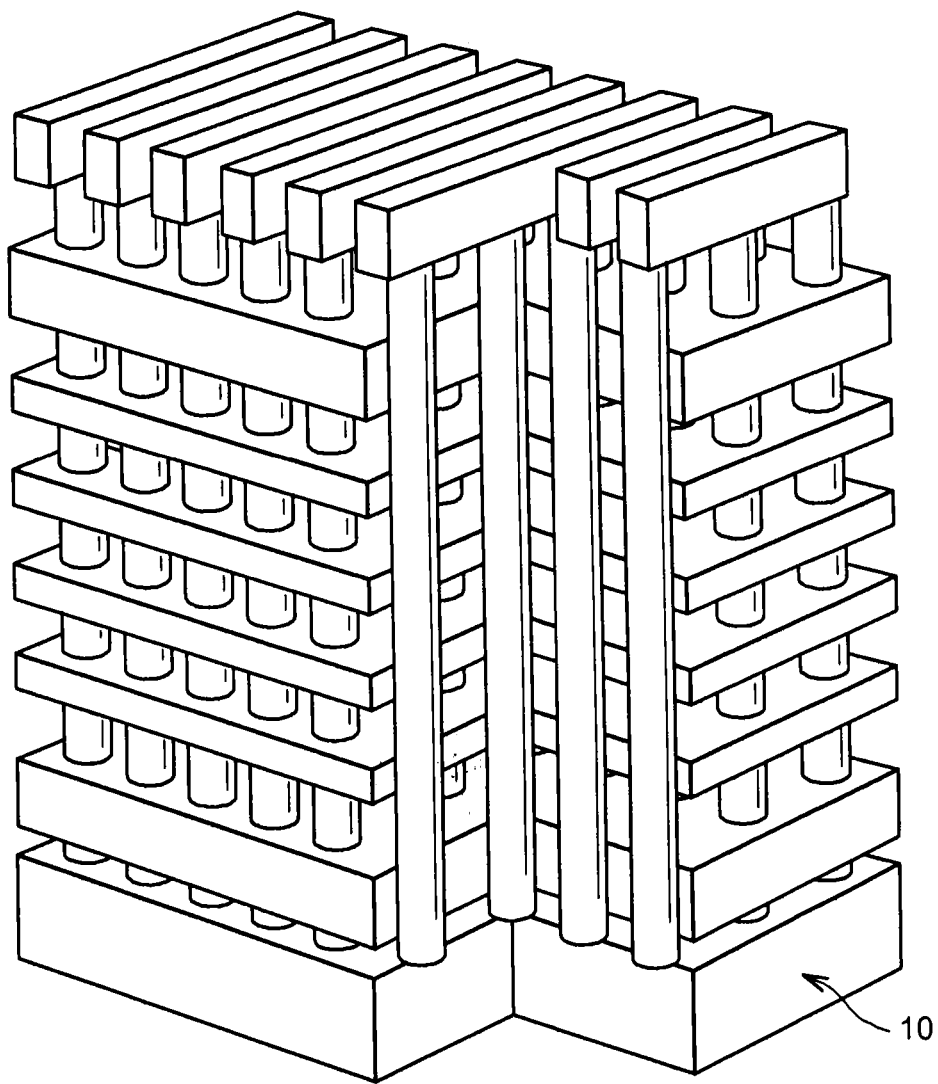
Figure 3:
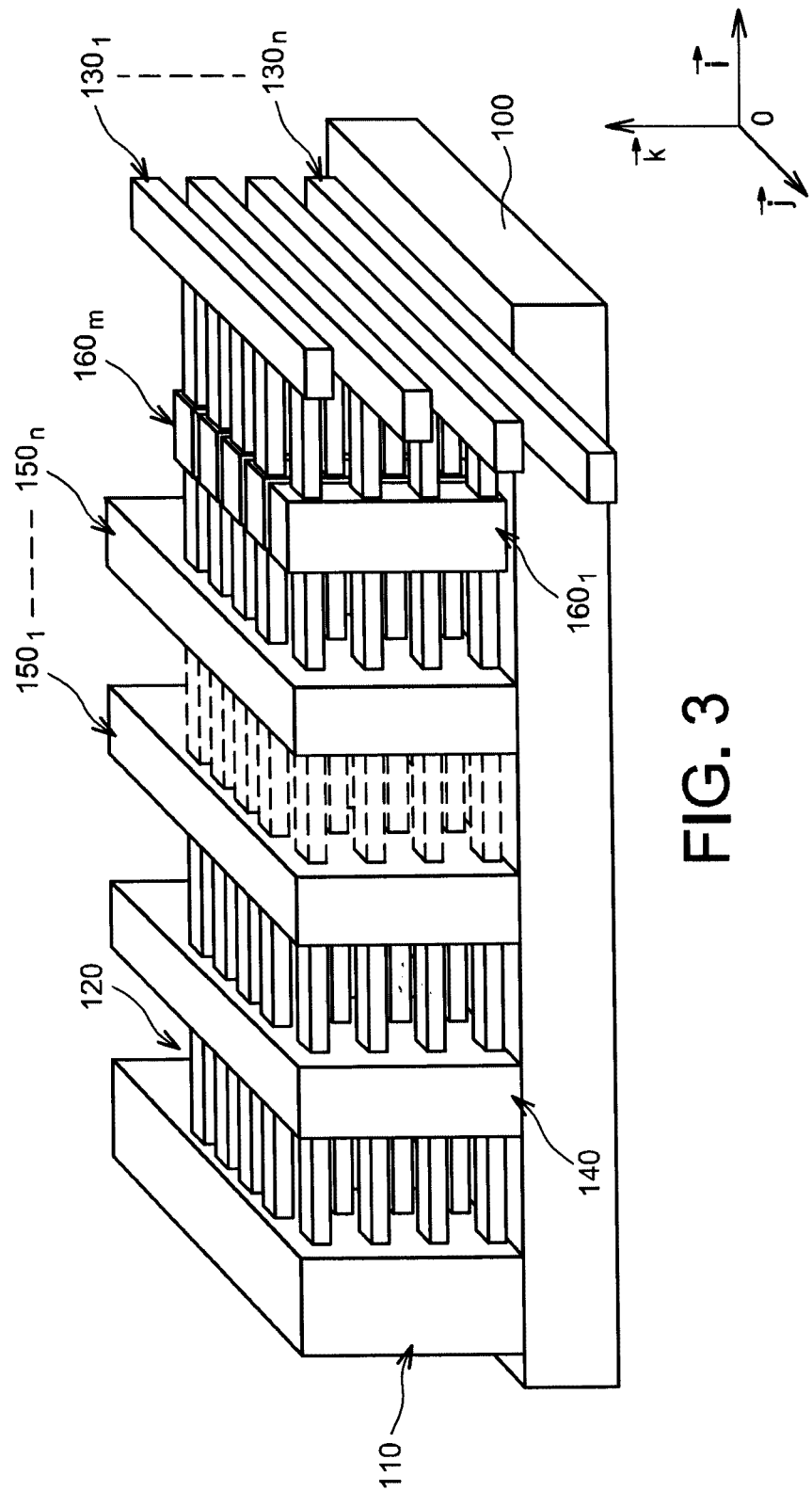

The device is made of a stack of etched layers.

In this example, the stack can be formed by alternating semi-conductor layers different in terms of the semi-conductor material based on which they are formed.

This stack can be formed by alternating semi-conductor materials, for example a first semi-conductor material such as Si, and a second semi-conductor material, such as SiGe.

According to a variant, this stack can be formed by alternating semi-conductor materials, for example a first semi-conductor material such as Si, which is doped or strongly doped, for example doped with phosphorous atoms, and the same semi-conductor material, but which is not doped or which is doped according to a weaker dose.

This stack comprises a block 210 of common source which in this example is a strongly doped semi-conductor block, for example doped N+. A contact zone 211 can be provided on the block 210 of common source.

Bars, each 220 formed in the stack 202 of semi-conductor materials, connect the block 210 of common source to zones of a second block 215 of the stack provided for contact with bit lines. The bars 220 are provided to form transistor channels. In this example, the channels are partially depleted. A contact 201 commonly known as "body" can be provided by the substrate 100. The contacting 201 body can be made conventionally as an enclosure on the front face of the substrate. Such a contact 201 can erase the entire plane memory.

In this example, the bars can be provided with a width W greater than twice the depletion depth in the bars. For example, in the case of bars based on Si doped with type P according to doping of boron atoms for example of the order of $10^{18}$ cm$^{-3}$, a bar width greater than 2*25 nanometers, for example of the order of 80 nanometers, can be provided.

Control gates $250_1, \ldots, 250_n$ rest on a tri-layer stack formed from an insulating layer 256, a layer 254 for storage of electrons and a layer of gate dielectrical 252.

The layer of gate dielectrical 252, as well as the insulating layer 256 in contact with the gate material, can be for example based on SiO$_2$. The storage zone 254 of the electrons can be for example based on SixNy or other similar dielectrical material also having load-trapping properties. The charge storage layer 254 can also be formed by semi-conductor or metallic islets encapsulated in a dielectrical matrix, such as islets of Si, Ge, SiGe, Pt, W, Co, Ni, Au, in a matrix of SixOy, or SixNy.

The layer 254 for storage of electrons can have a thickness of for example between 1 nanometer and 15 nanometers or for example of the order of 5 nanometers.

Figure 4A:
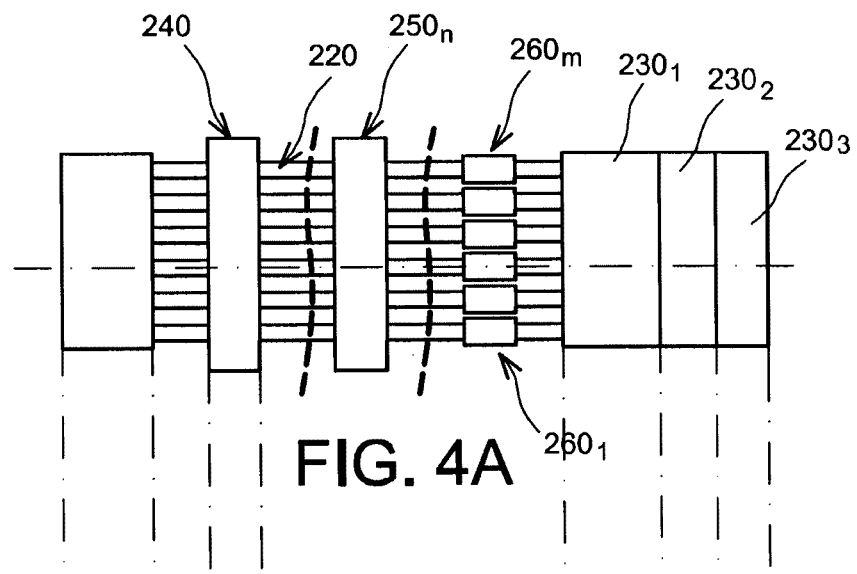
FIGS. 4A and 4B illustrate an example of a microelectronic flash memory device, similar to the one just described with n control gates $250_1, \ldots, 250_n$ (a single control gate $250_n$ being shown in these figures) and p (with in this example p=3) bit lines $230_1, 230_2, \ldots, 230_3$.
Figure 4B:
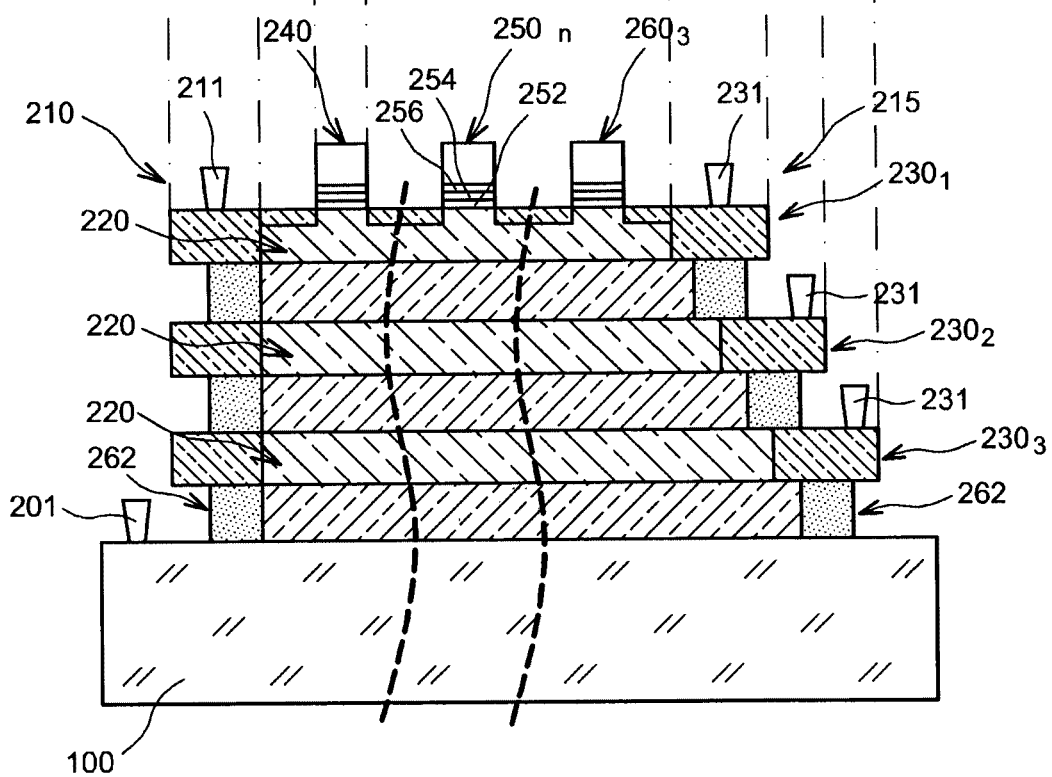

In this example, the device comprises m second selection gates $260_1, \ldots 260_m$ (the gate $260_3$ being shown in the sectional view of FIG. 4B).

This stack comprises an etched block 215 comprising a stepped profile with steps provided for contacting zones 231, for example based on doped semi-conductor material, with bit lines $230_1, 230_2, \ldots, 230_p$. These contact zones 231 are located at the ends of the semi-conductor bars 220. Insulating spacers 262 are provided for insulating the semi-conductor bars 220 from one another, and for insulating the bit lines $230_1, 230_2, \ldots, 230_p$ from one another.

Figure 5:
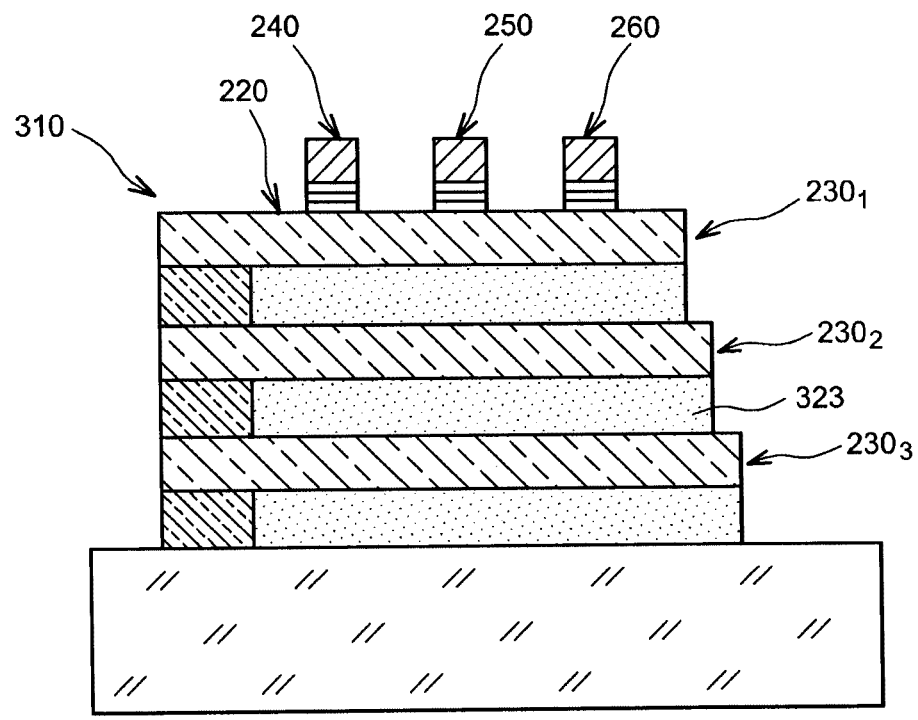

FIG. 5 shows a variant of the device previously described. The semi-conductor bars arranged in a matrix are this time separated and insulated from one another by dielectrical material 323, for example such as SiO$_2$.

A block of common source 310 can as such be based on semi-conductor material and formed by alternating semi-conductor layers, not doped, for example based on Si, and doped semi-conductor layers, for example based on Si doped in phosphorous.

According to a possibility, such a device can be provided with completely depleted channels. In this case, the memory can be erased word line by word line. A word line corresponds to all memory points sharing the same control gate.

According to a variant (not shown), the block of common source 310 can be formed by a conductive or semi-conductor zone inserted into the stack of layers.

An example of a production process of a microelectronic device according to the invention, of the type such as described previously in conjunction with FIGS. 4A-4B, will now be given.

In this example, a device with a number p of bit lines such as p=4, and with a number n=6 of vertical rows, is given. Memory according to the invention is not limited to such a number of bit lines, nor to such a number of vertical rows.

The first step of this process consists of making a stack 202 of thin semi-conductor layers on a substrate 200 which can be for example a solid substrate based on silicon of type P.

The stack 202 is formed by semi-conductor layers $204_1, \ldots, 204_8$ which can be made for example by several successive epitaxies from the substrate 200.

The stack 202 can be formed by alternating semi-conductor layers, comprising layers $204_2, 204_4, \ldots, 204_8$, based on first semi-conductor material 206, which can be semi-conductor, such as for example optionally doped Si, for example doped in boron, and layers denoted as $204_1, 204_3, \ldots, 204$, based on second semi-conductor material 207, different to the first semi-conductor material 206.

The second semi-conductor material 207 can be a material which can be etched selectively vis-à-vis the first semi-conductor material 206. The second semi-conductor material 207 can be for example SiGe, optionally doped with boron.

In this example of an embodiment, the first semi-conductor material 206 and the second semi-conductor material 207 can be doped in-situ during epitaxia. The semi-conductor materials 206 and 207 are doped according to the same type of doping. According to a variant, the semi-conductor materials 206 and 207 can be doped N.

The layers $204_2, \ldots, 204_8$, based on the first material 206 can have a thickness $e_1$, for example between 5 nanometers and 300 nanometers.

The layers $204_1, \ldots, 204_7$, based on the second material 207, can as such have a thickness $e_2$, for example between 5 nanometers and 300 nanometers.

Once the stack 202 is made, a protective layer 209 is deposited, for example based on Si$_x$N$_y$, designed to protect the stack 202 from etching such as plasma etching for example. Next, a layer of photosensitive resin is deposited (not shown), for example based on polyimide, on the protective layer 209 and a resin mask comprising a plurality of patterns is defined in the layer of resin, for example by photolithography. Next, anisotropic etching of the protective layer 209 protected by the resin mask is performed.

Then comes a first etching step of the layers $204_1, \ldots, 204_8$ located under the protective layer 209 to reproduce the patterns of the latter in the stack 202. The etching can be of anisotropic type, and done for example by means of plasma based on CF$_4$, HBr, O$_2$.

Figure 6A:
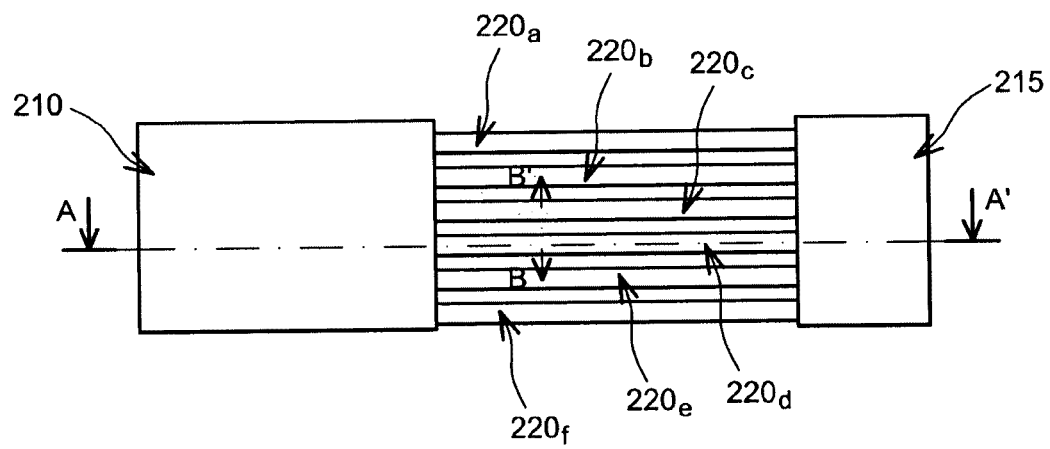

In FIG. 6A, once the stack 202 is etched, it is shown according to a plan view.

This etched stack 202 comprises a first block 210 in which a common source region having several transistors is intended to be made, a second block 215 in which drain regions and contacting zones on these drain regions are to be created, as well as a plurality of blocks 220a, 220b, 220c, 220d, 220e, 220f, of elongated form, distinct, connecting the first block 210 and the second block 215.

Figure 8B:
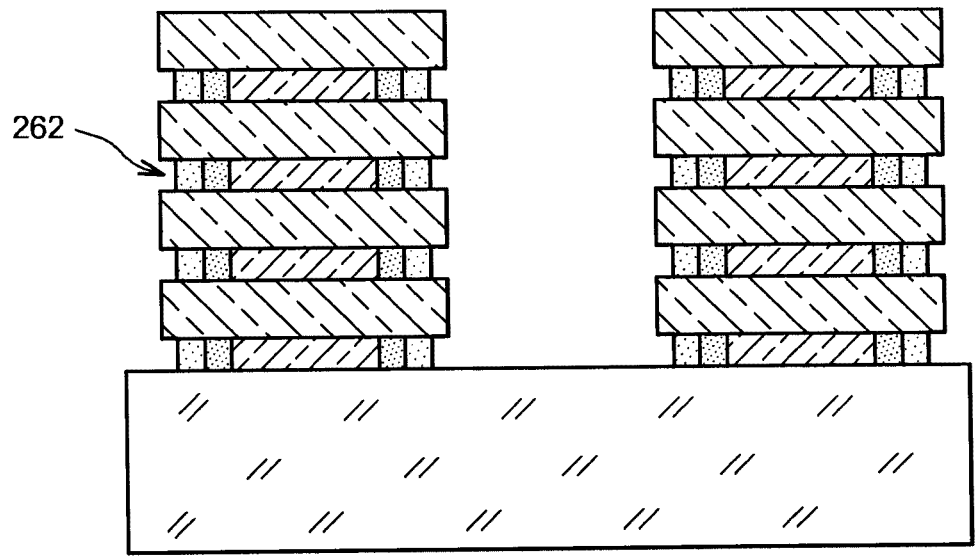
Figure 7N:
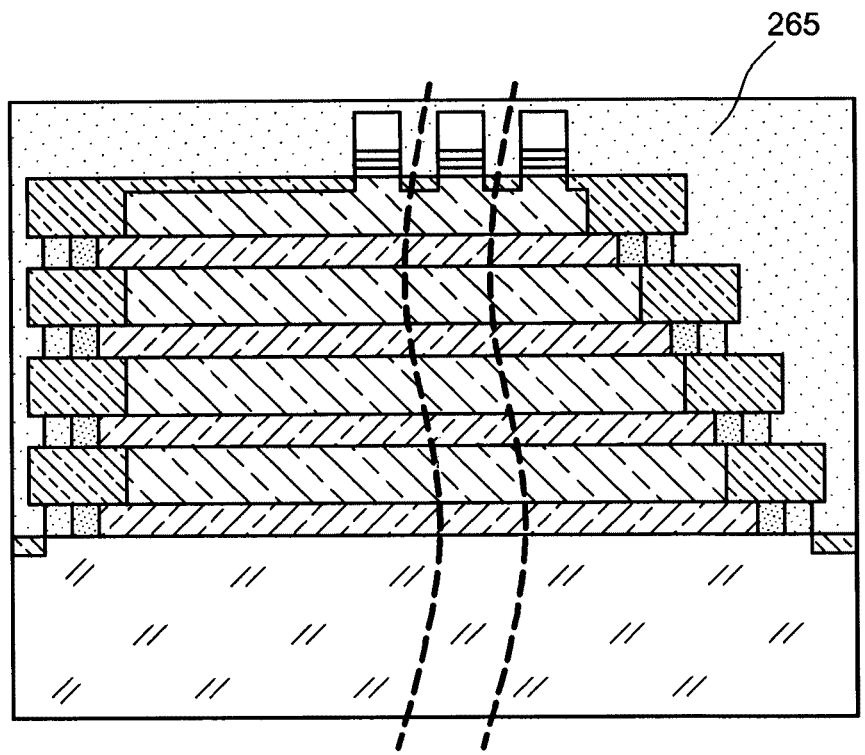
Figure 8E:
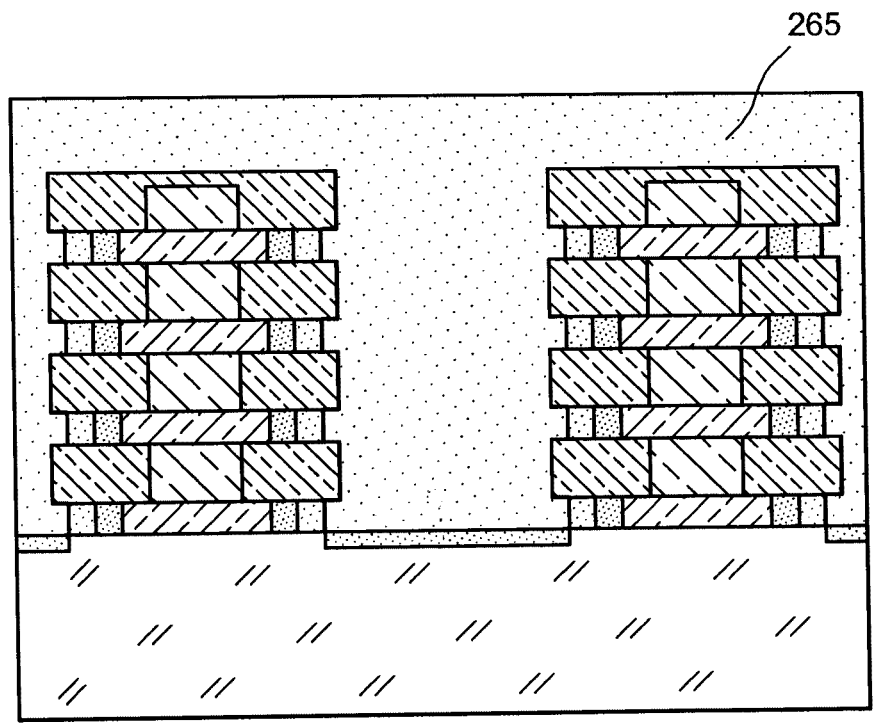
Figure 6D:
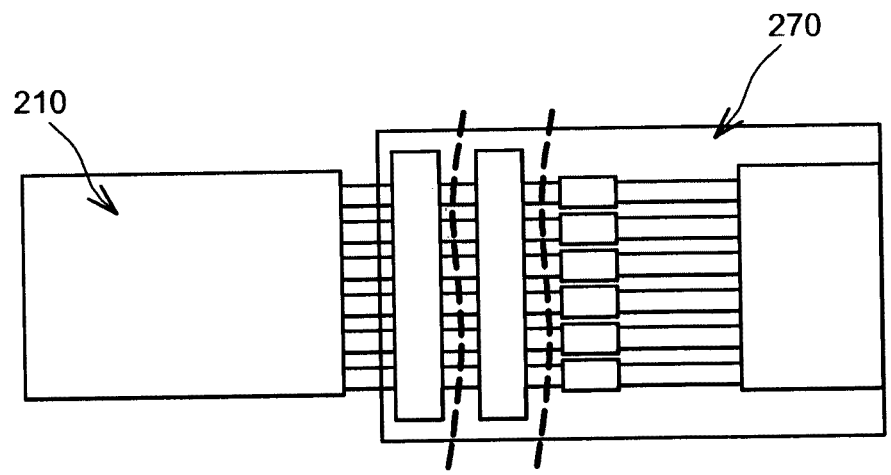
Figure 7A:
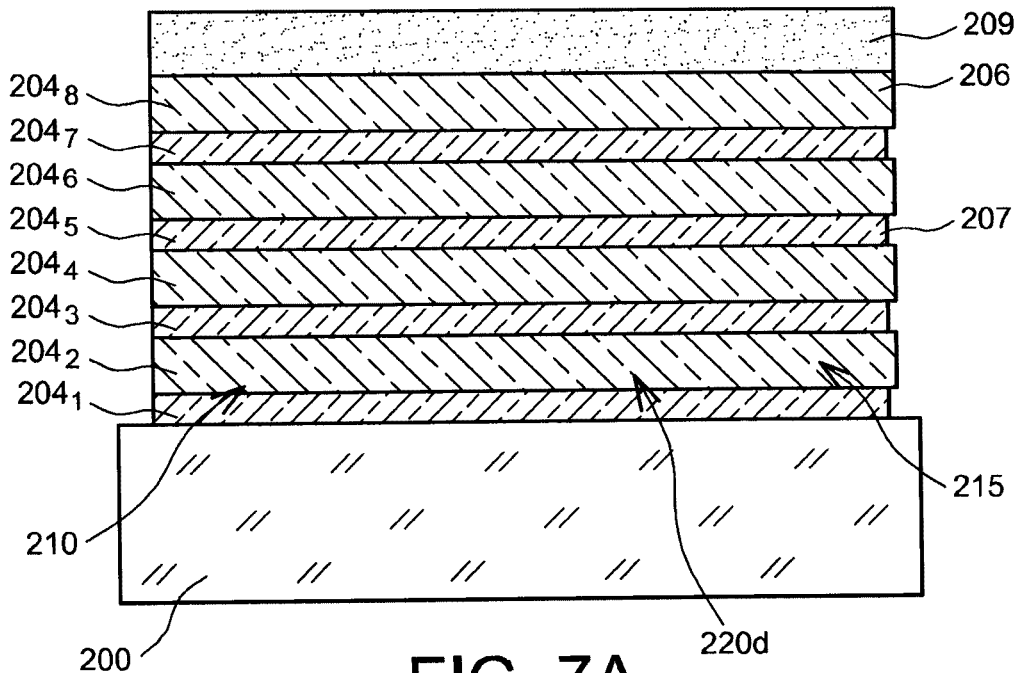
Figure 8A:
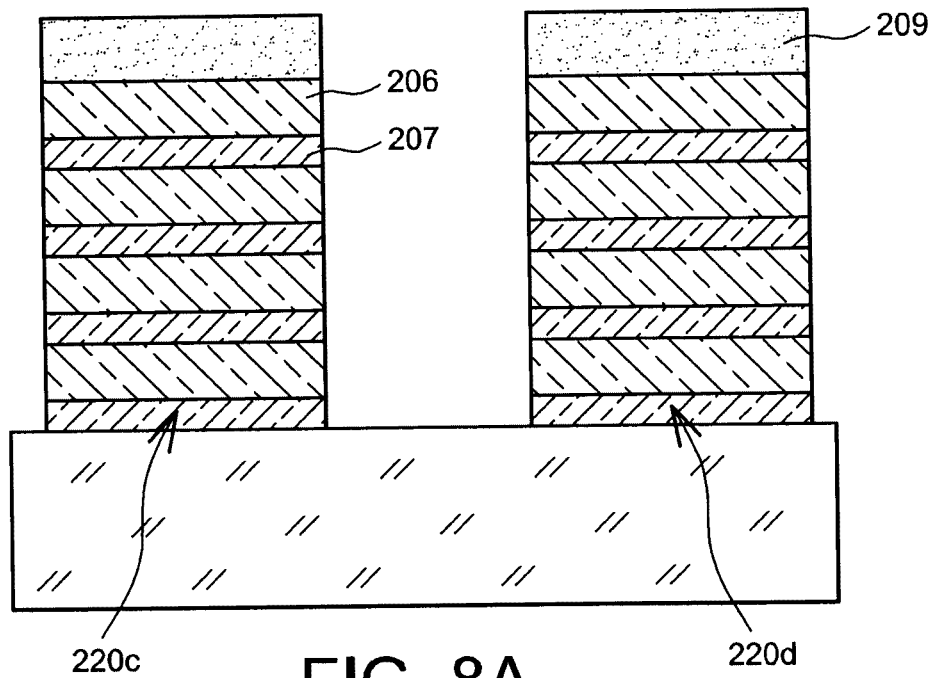

In FIGS. 7A and 8A, the same stack 202 is shown respectively according to a first transversal sectional view A'A, and according to a second transversal sectional view B'B (the cuts A'A and B'B are both indicated in FIG. 6A).

Next, a stepped profile is formed in the second block 215 of the stack 202, thus creating steps in the second block 215 forming placements for future contacts with the semi-conductor layers $204_8$, $204_6$, $204_4$, $204_2$.

For this, a resin mask 240 is first formed, revealing part of the protective layer 209 located on the second block 215.

Figure 7B:
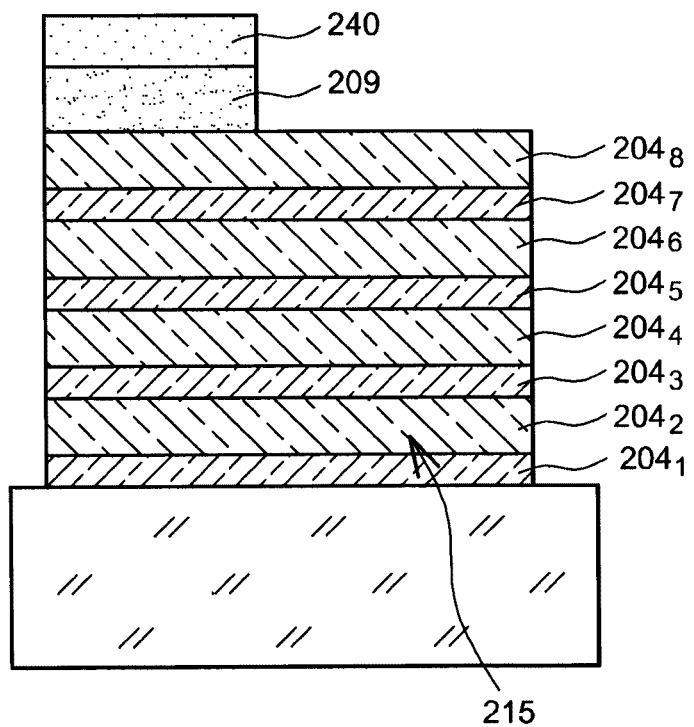

Part of the protective layer 209 located on the second block 215 is then removed so as to reveal at the level of the second block 215 a portion of the upper layer $204_8$ of the stack 202 of semi-conductor layers (FIG. 7B).

Then, a portion of the two upper layers $204_8$, $204_7$ of the stack 202 is withdrawn at the end of the second block 215. This is how a first step of the stepped profile is formed.

For this, a revealed portion of the upper layer $204_8$ of the stack 202, as well as a portion of the layer of the stack 202 located under said portion of the upper layer $204_8$ are etched for example by means of anisotropic plasma etching.

Figure 7C:
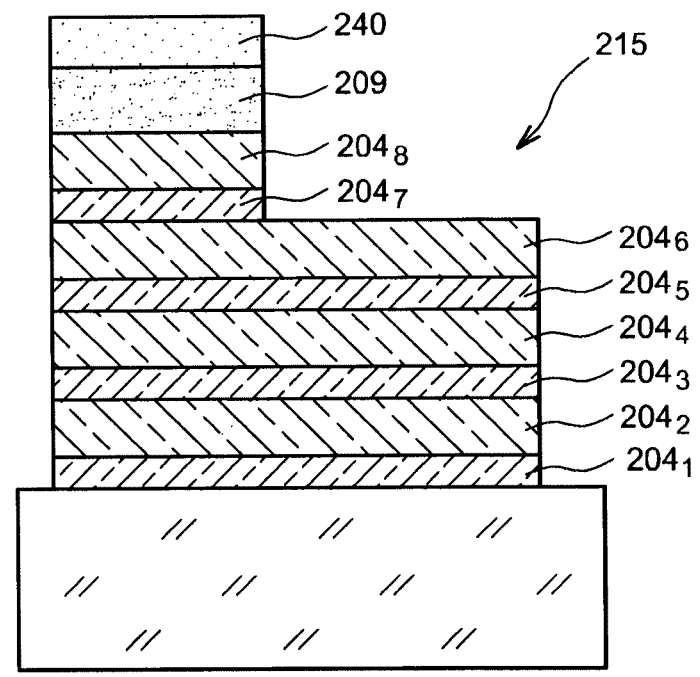

Once this removal is completed, a portion of a layer $204_6$ of the stack is revealed and forms contacting placement with the semi-conductor layer $204_6$ (FIG. 7C).

Figure 7D:
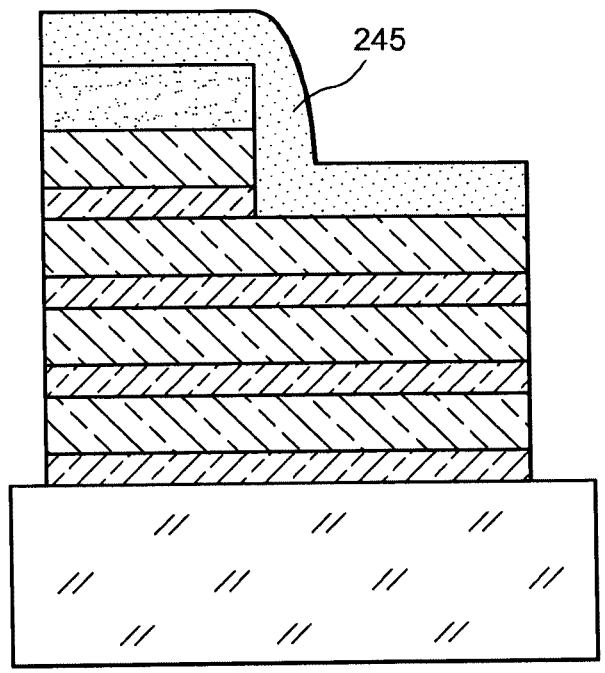

Next, an insulating layer 245 is deposited on the stack (FIG. 7D).

Figure 7E:
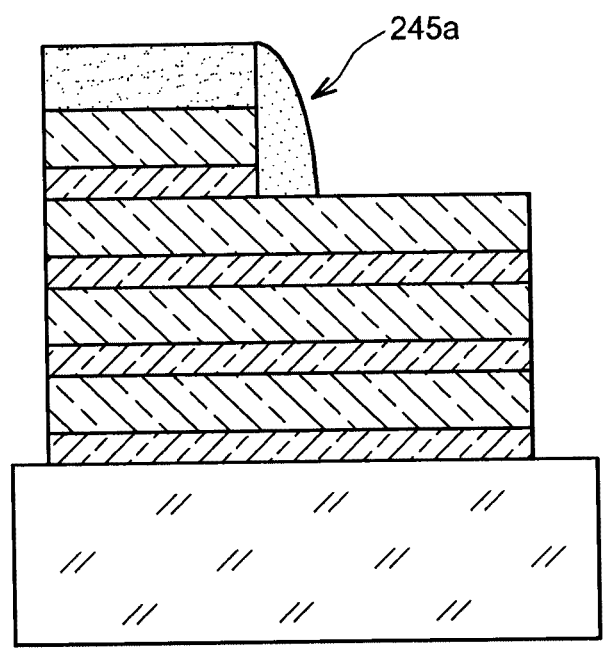

Then, this insulating layer 245 is etched so as to retain a first insulating block 245a originating from this insulating layer, provided with the protective layer 209, for masking the semi-conductor layers $204_8$ and $204_7$ of the stack, and protect the latter from later etching (FIG. 7E).

Figure 7F:
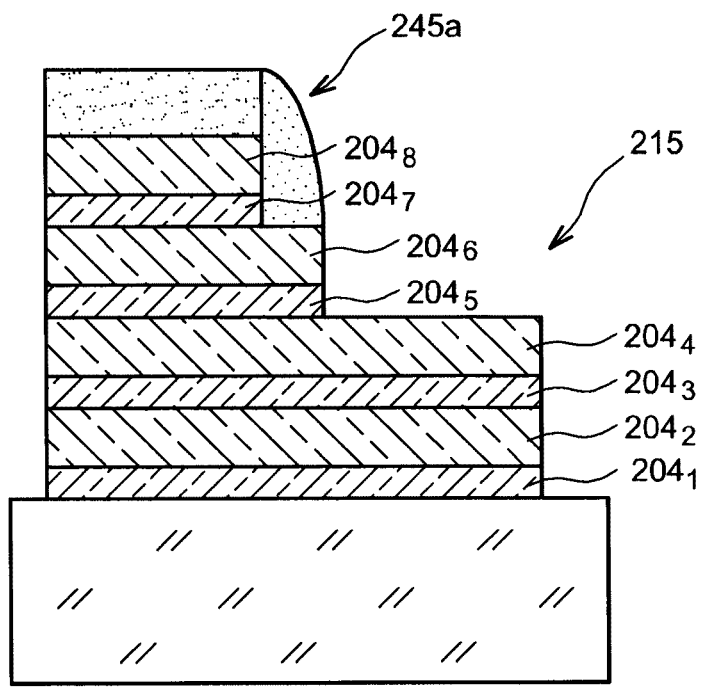

A revealed portion of the following two layers $204_6$ and $204_4$ of the stack is removed, located at one end of the second block 215. This is how a second step of the stepped profile is formed (FIG. 7F).

Figure 7G:
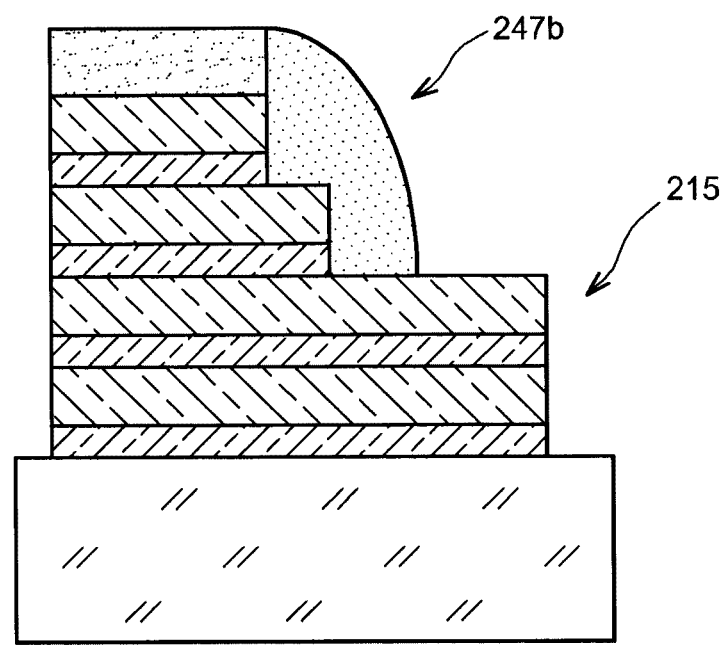

Next, another insulating layer is deposited, after which this other insulating layer is etched so as to leave another insulating block 247b formed above the insulating block 245a, and intended, with the protective layer 209, to mask the semi-conductor layers $204_8$, $204_7$, $204_6$ and $204_5$ (FIG. 7G).

Figure 7H:
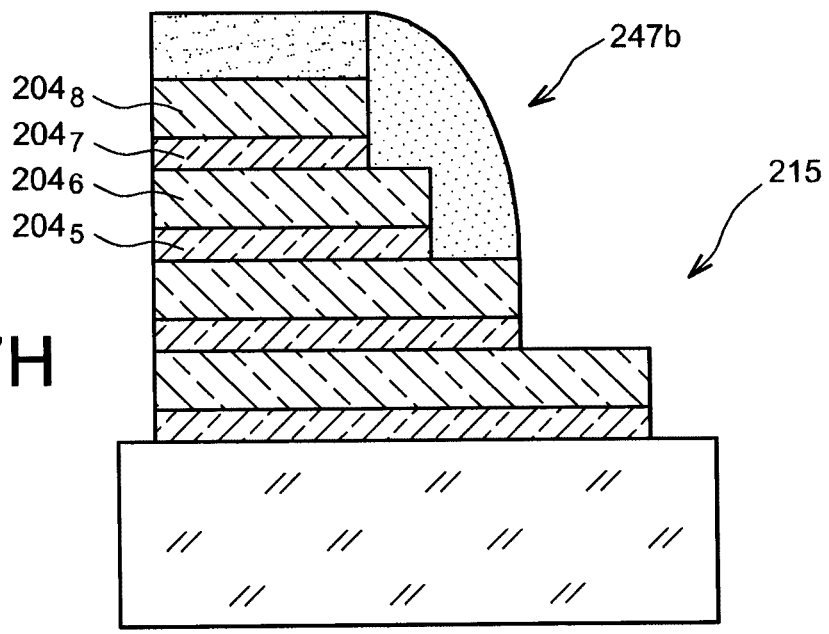

A portion of the layers $204_4$, $204_3$ of the stack 202 is then removed at the end of the second block 215. In this way a third and a fourth step of the stepped profile E1, E2, E3, E4 (FIG. 7H) is formed.

The steps which have just been described are repeated a number of times, as necessary, to form a stepped profile comprising p steps from a stack comprising 2p semi-conductor layers.

Figure 7I:
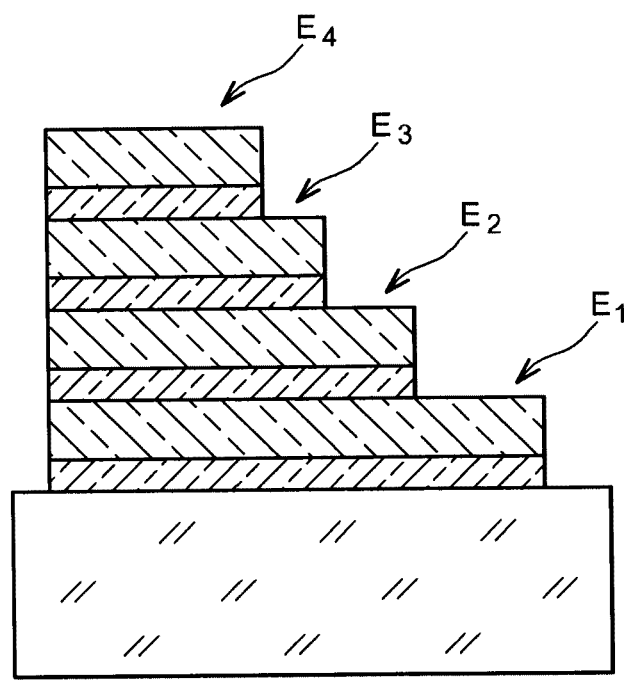

Next, the insulating block 247b and the protective layer 209 are removed by means of selective anisotropic etching, for example based on $H_3PO_4$, to reveal the steps E1, E2, E3, E4 (FIG. 7I).

According to another example of an embodiment of the stepped profile E1, E2, E3, E4 made in the second block 215, the steps can be taken by successive reductions ("trimming") of a resin mask.

In the example described in FIG. 7I, a stepped profile having 4 steps comprising 4 levels of stacked bars was effected. Contacting placements were accordingly formed (FIG. 7I).

It is possible nevertheless according to the number of semi-conductor layers provided in the stack 202 to make a stepped profile with a larger number of steps.

Next, insulating spacers are formed about the layers of the stack 202 which are based on the second semi-conductor material 207.

For this, etching of the stack 202 is performed, both isotropic and selective, to partially remove the layers $204_1$, $204_3$, ..., $204_7$ from the stack 202, which are based on the second semi-conductor material 207, for example based on SiGe. Etching can be isotropic etching of the second semi-conductor material 207, selective vis-à-vis the first semi-conductor material 206, for example Si. Such etching can be done for example by means of plasma based on fluoride, for example based on $CF_4$, in the case where the second semi-conductor material 207 is SiGe (FIG. 7J).

Etching causes removal of portions of the layers $204_1$, ..., $204_7$, based on the second semi-conductor material 207, on either side of the stack 202, at the level of the flanks or lateral faces of the latter. The selective etching step preferably impacts the layers $204_1$, ..., $204_7$ based on the second semi-conductor material 207 and leaves the other layers intact.

Figure 7J:
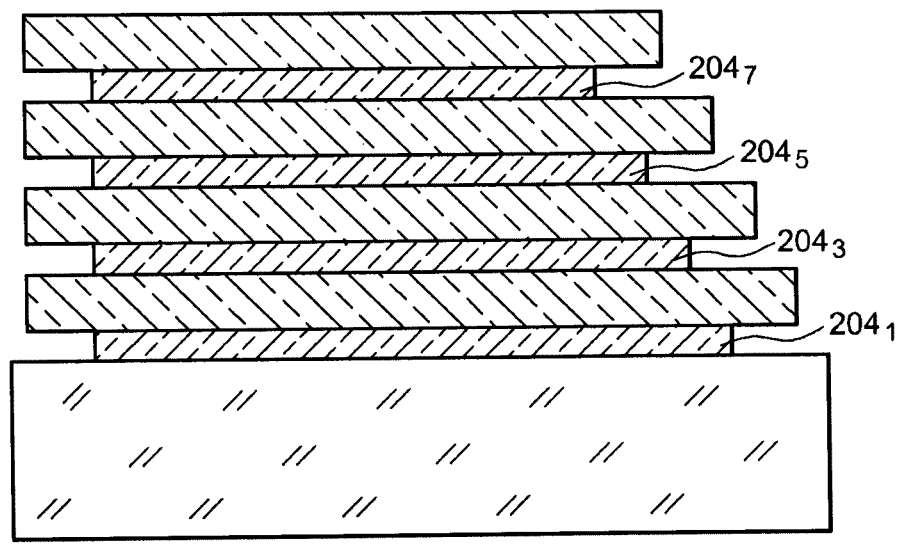

As shown in FIG. 7J, representing a sectional view of the stack, the etched layers $204_1$, $204_3$, ..., $204_7$, based on the second semi-conductor material 207, have extended less than those of the other layers $204_2$, $204_4$, ..., $204_8$, based on the first semi-conductor material 206.

As a result of etching, the stack 202 comprises on its flanks, or on each of its lateral faces, a slotted profile.

Next, insulating zones or insulating spacers 262 are formed on the flanks or lateral faces so as to at least partially backfill the parts of the layers $204_1$, ..., $204_7$, which have been removed by selective etching of the stack 202.

Figure 7K:
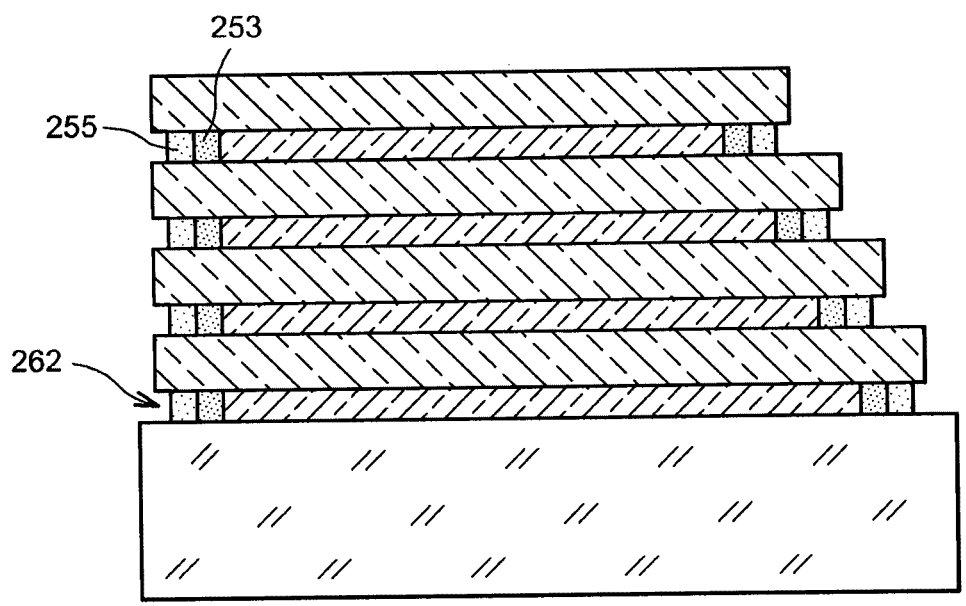

These insulating spacers 262 can be formed first by depositing a first insulating layer 253, for example based on $SiO_2$, then a second insulating layer 255, for example based on $Si_xN_y$, then partial isotropic etching of the second then of the first deposited insulating layers 253, 255. This partial etching is done so as to retain the insulating layers 253 and 255, preferably only about the removed parts of the layers $204_1$, ..., $204_7$, based on the second semi-conductor material 207. The remaining thickness of the insulating layers 253, 255 forms insulating spacers 262 on either side of the stack, on the flanks or lateral faces of the latter (FIGS. 7K and 8B, the same stack 202 being shown in these figures respectively, according to a longitudinal sectional view A'A, and according to a transversal sectional view B'B).

Next, the stack 202 is covered in a tri-layer 252, 254, 256, for example a tri-layer ONO (ONO for "Oxide Nitride Oxide"). The tri-layer is formed by a layer of gate dielectrical 252, for example based on $SiO_2$, then by a layer 254 of so-called load storage, provided according to a thickness and material favourable for the trapping of loads. The storage layer 254 can be for example based on $Si_xN_y$, or another dielectrical material having similar load-trapping properties.

The charge storage zone can also be formed by semi-conductor or metallic islets encapsulated in a dielectrical matrix, such as islets of Si, Ge, SiGe, Pt, W, Co, Ni, Au, in a layer for example based on $Si_xO_y$, or $Si_xN_y$. Next, another insulating layer 256 is deposited above the layer 254. The insulating layer 256 can be for example based on $SiO_2$.

Next, gate material 258 is deposited which can be semi-conductor such as for example polysilicon or metallic such as for example TiN, W, polysilicon silicide, TaN, Pt, PtSi or a combination of these materials.

Chemical mechanical planarisation (CMP) can then be completed.

Figure 6B:
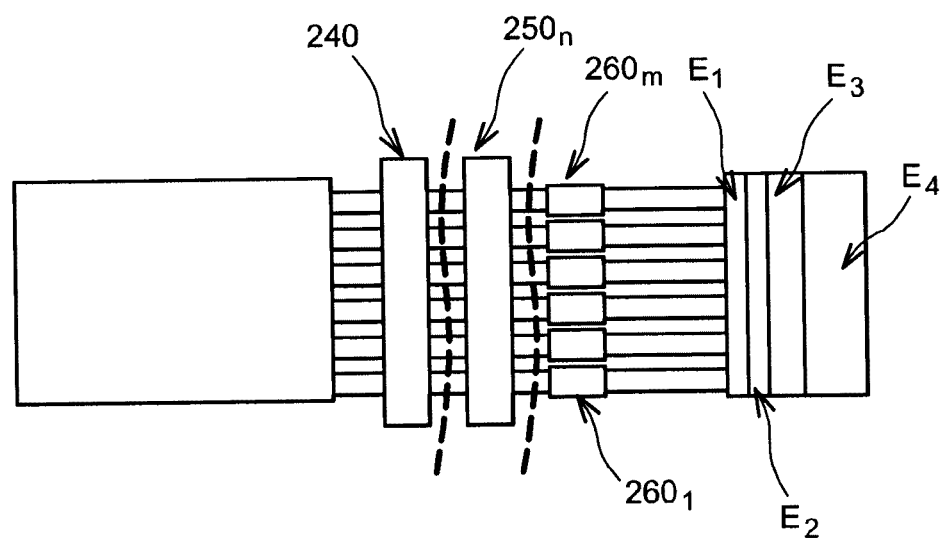
Figure 7L:
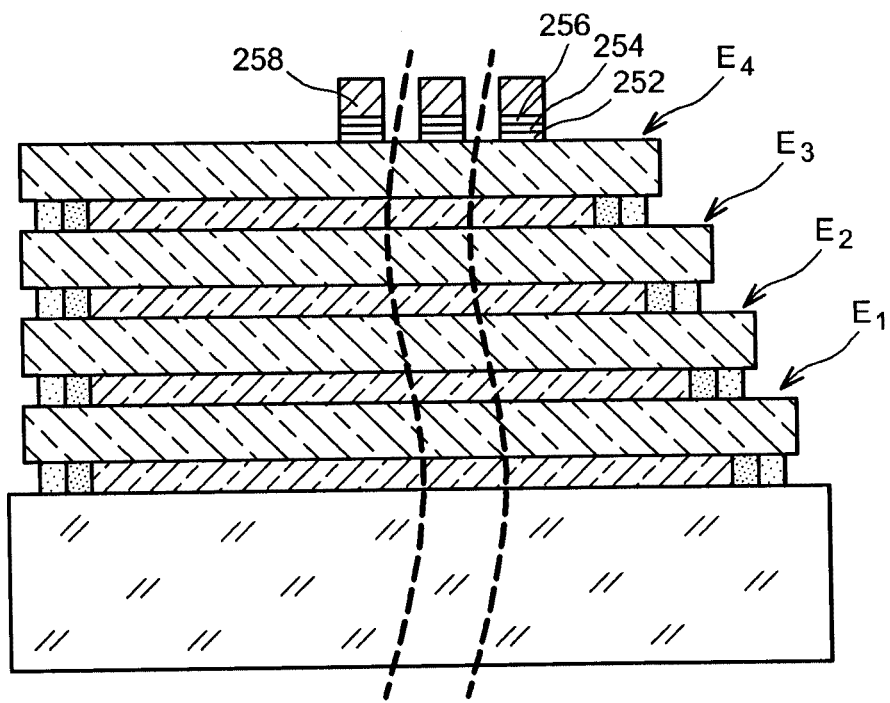
Figure 8C:
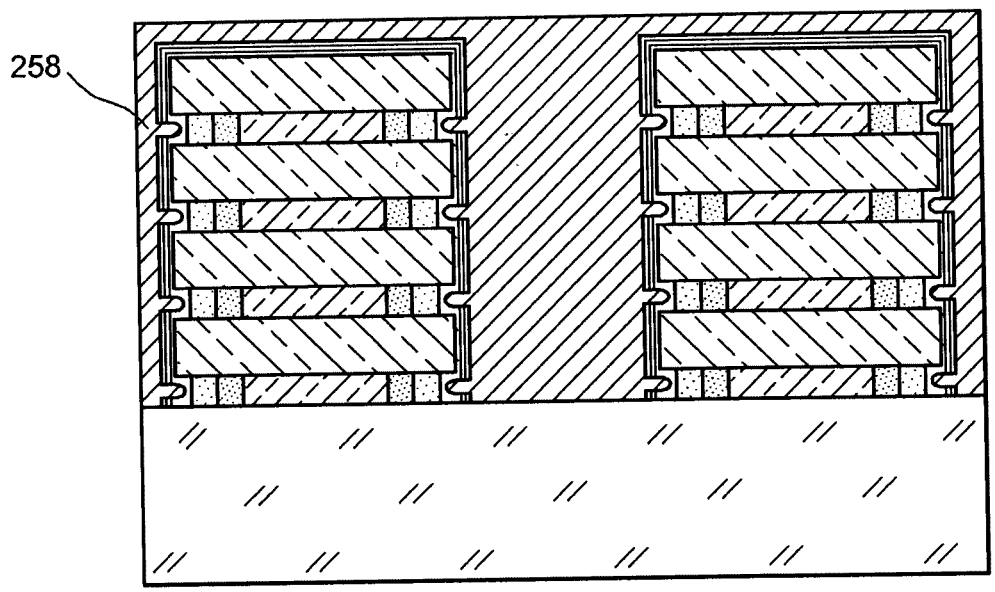

Next, gate patterns are formed by photolithography then etching of the gate material 258 and of the insulating layers 252, 254, 256 (FIGS. 6B, 7L and 8C, the same stack being shown in these figures respectively, according to a plan view, according to a sectional view A'A and according to a transversal sectional view B'B).

Several control gates $250_1, \ldots, 250n$ and several selection gates $260_1, 260_m$ can be formed (in FIGS. 6B, 7L, and 8C, only 1 control gate $250n$ of several control gates being shown).

Next, superficial doping of the layers $204_2, 204_4, 204_6, 204_8$, of the stack 202 is performed.

Figure 7M:
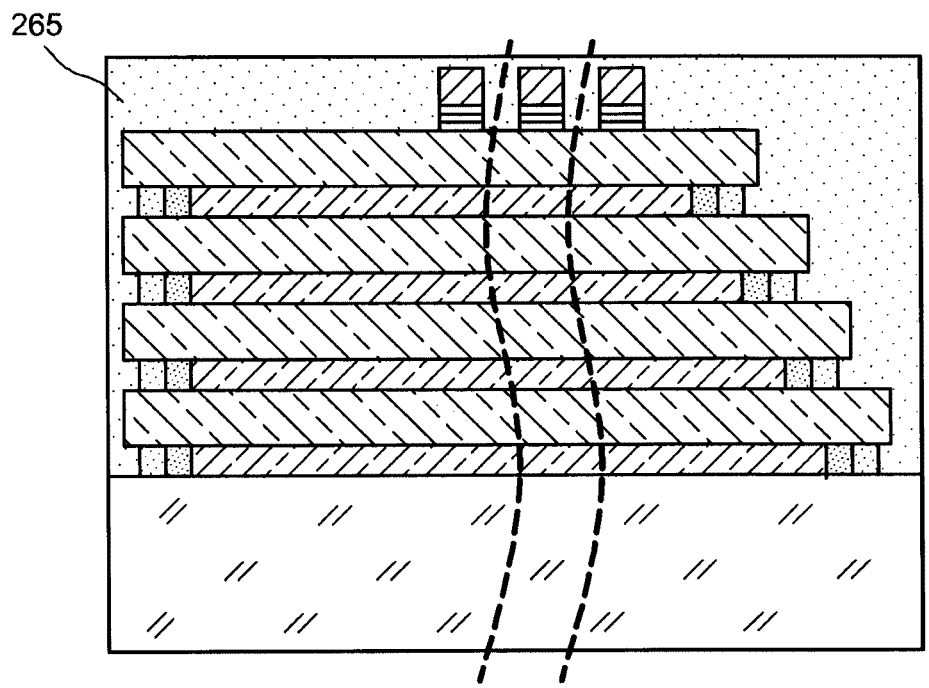
Figure 8D:
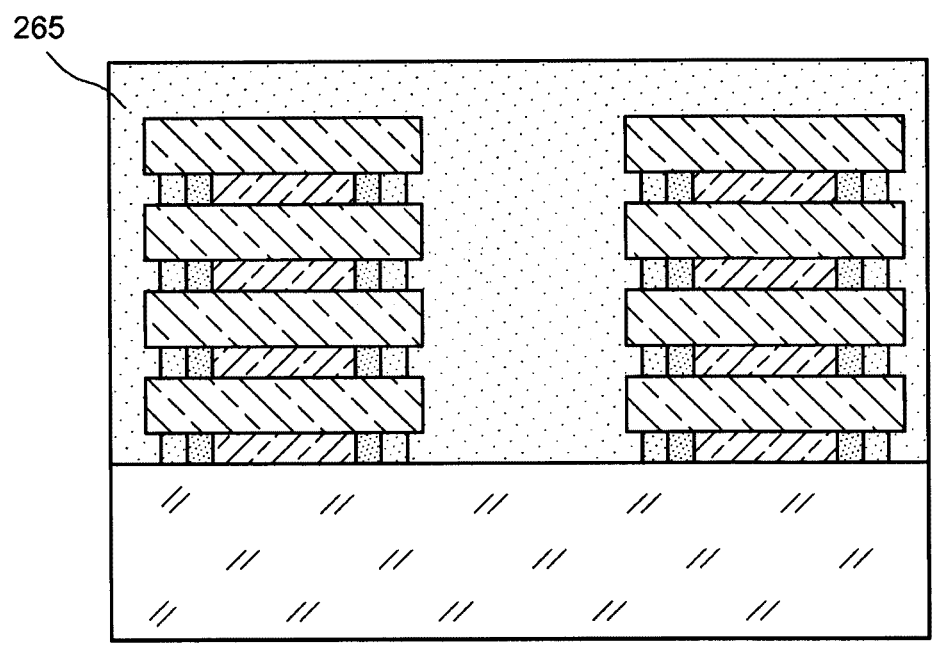

This doping can be carried out for example by diffusion, for example by depositing doped insulating material such as doped oxide 265 $Si_xO_y$. The doped oxide can be provided for doping the semi-conductor layers $204_2, 204_4, 204_6, 204_8$, for example according to doping N+ (FIGS. 7M, and 8D, the same stack being shown in these figures, respectively, according to a longitudinal sectional view A'A, and according to a transversal sectional view B'B). The spacers 262 made previously thus block diffusion of the dopants so as not to dope the second semi-conductor material 207. This superficial doping is performed such that only the first semi-conductor material 206 is doped N+ or P+ on a depth LD_Si, for example between 5 nanometers and 200 nm, or for example of the order of 30 nm.

Figure 6C:
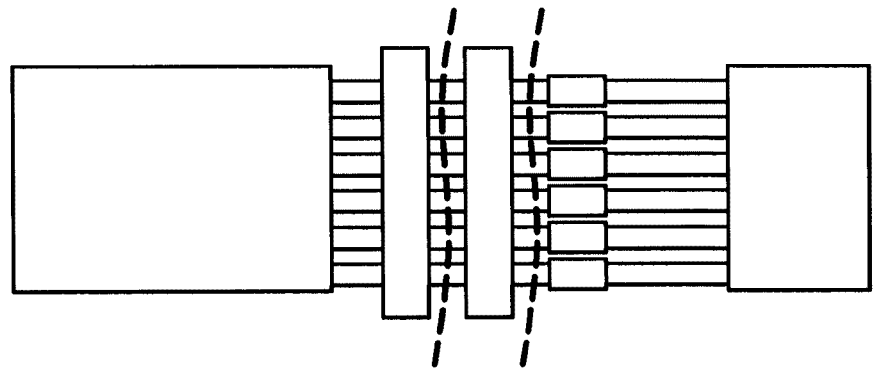

Bit lines, to be formed on the zones E1, E2, E3, E4 will be insulated from one another by the internal spacers and optionally by the second semi-conductor material 207 (FIGS. 7N and 8E, the same stack 202 being shown in these figures respectively, according to a transversal sectional view A'A, and according to a transversal sectional view B'B indicated in FIG. 6C).

According to a possible variant, the doping step can be done by means of plasma (doping of PLAD type), so as to carry out doping at minimal depth, that is, a depth which can be between 5 nanometers and 80 nanometers, for example of the order of 20 nm.

Next, a common source is formed in the first block 210.

For this, a layer of resin is formed on the oxide layer 265, then a resin mask 270 is formed from this layer of resin. The resin mask 270 is formed so as to reveal the stack 202 at the level of the first block 210. Part of the oxide layer 265 which is not protected by the resin mask 270 is then removed. For this, etching is performed, for example anisotropic, of the doped oxide 265. This etching can be done for example by means of plasma.

Figure 7O:
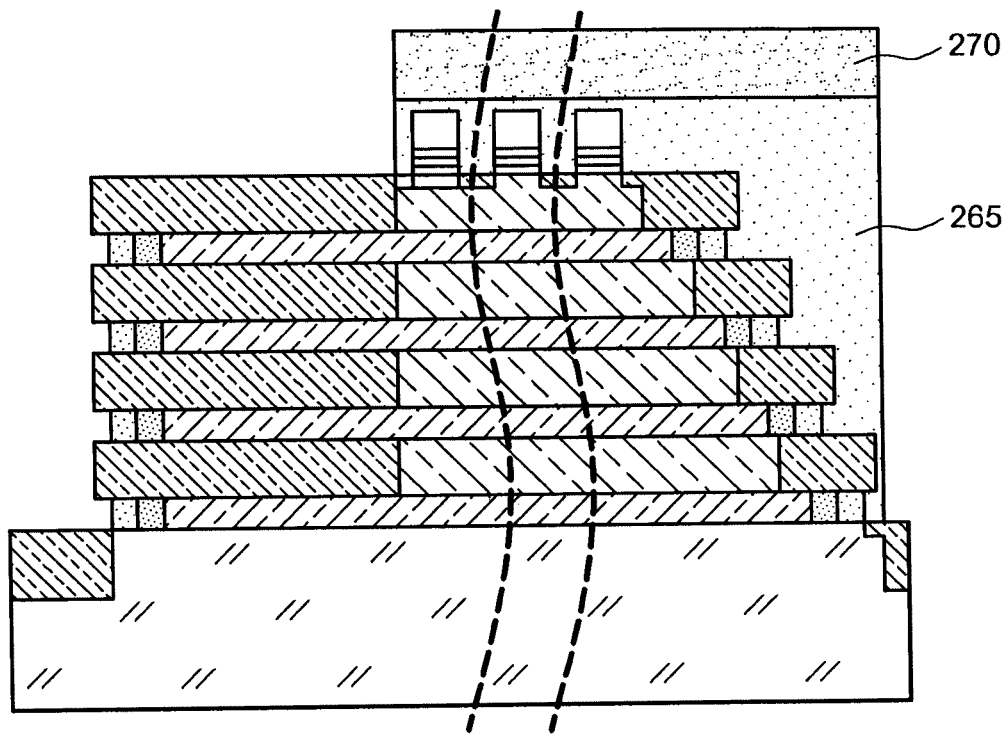

Next, a common source is formed in the block 210 by doping this block 210, for example by implantation N+ or P+ (FIG. 7O).

According to a variant of the example of a process which has just been described, a stack of semi-conductor layers can be formed by alternating semi-conductor layers, comprising layers $304_0, 304_2, 304_4, \ldots, 304_7$, based on semi-conductor material which can be semi-conductor, for example such as Si, and which is strongly doped, for example doped with atoms of phosphorous, and layers denoted $304_1, 304_3, \ldots, 304_7$, based on the same semi-conductor material, for example Si, but which is not doped or which is doped according to a lower dose than that of the layers $304_0, 304_2, 304_4, \ldots, 304_7$.

Figure 9A:
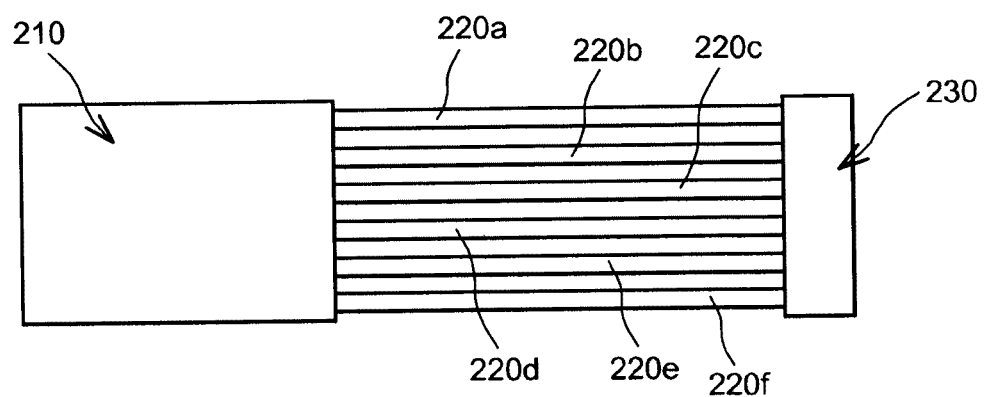
Figure 10A:
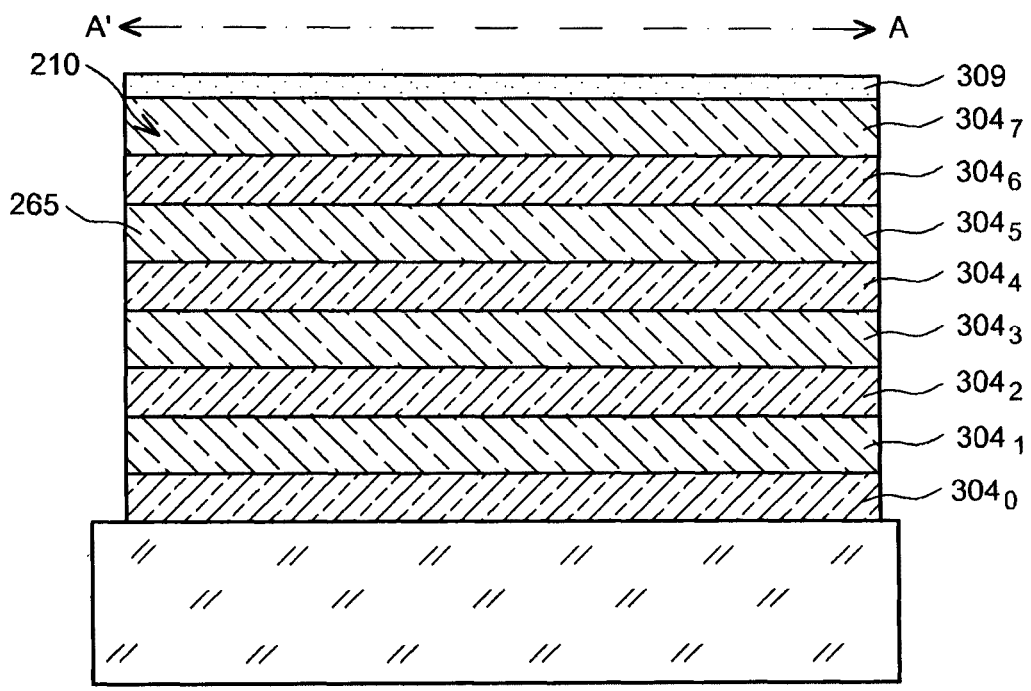
Figure 11A:
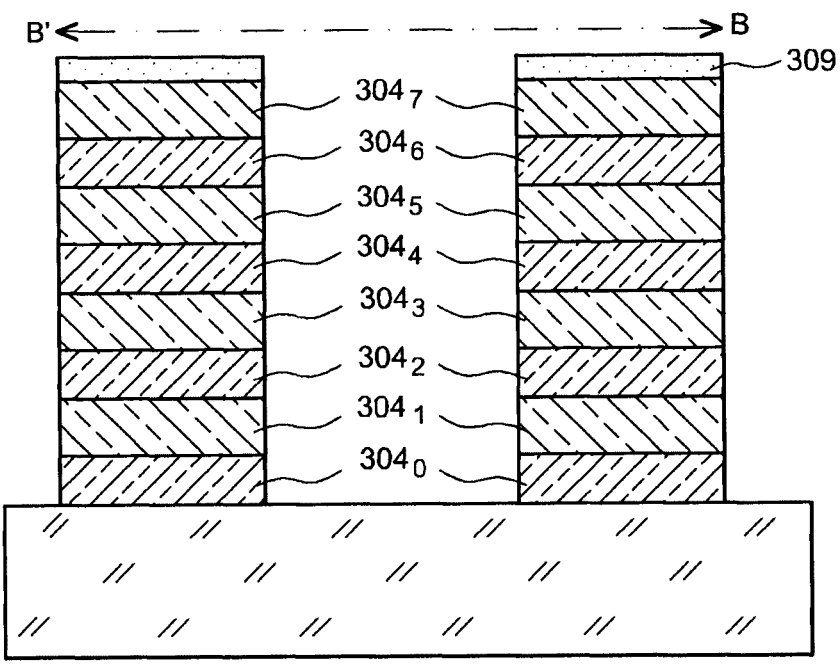

Next, the first block 210 is formed, the second block 230 and the blocks $220a, 220b, 220c, 220d, 220e$ which are distinct and elongated in form connecting the first block 210 and the second block 215, by etching, for example by means of plasma based on $CF_4$, HBr, $O_2$, of the stack 202 through a hard mask 309, (FIGS. 9A, 10A and 11A, the same stack 202 being shown in these figures respectively, according to a plan view, according to a sectional view A'A indicated in FIG. 9A, and according to another sectional view B'B indicated in FIG. 9A).

Next, a stepped profile is formed at the end of the block 230 to form contacting zones of bit lines.

Next, in the second block 215 and in the blocks $220a, 220b, 220c, 220d, 220e$, the layers $304_1, 304_3, 304_5, 304_7$ are insulated electrically from one another.

This step can be performed by oxidation of the layers $304_0, \ldots, 304_6$. The oxidation can be preferred oxidation of the semi-conductor layers $304_0, \ldots, 304_6$, for example based on Si strongly doped relative to the semi-conductor layers $304_1, \ldots, 304_7$ for example based on Si weakly doped or not doped.

Preferred oxidation means that the layers $304_0, 304_4, 304_6$, based on strongly doped silicon have a greater tendency to oxide and more rapidly so than those of $304_1, \ldots, 304_7$, which are less doped or not doped.

Figure 10B:
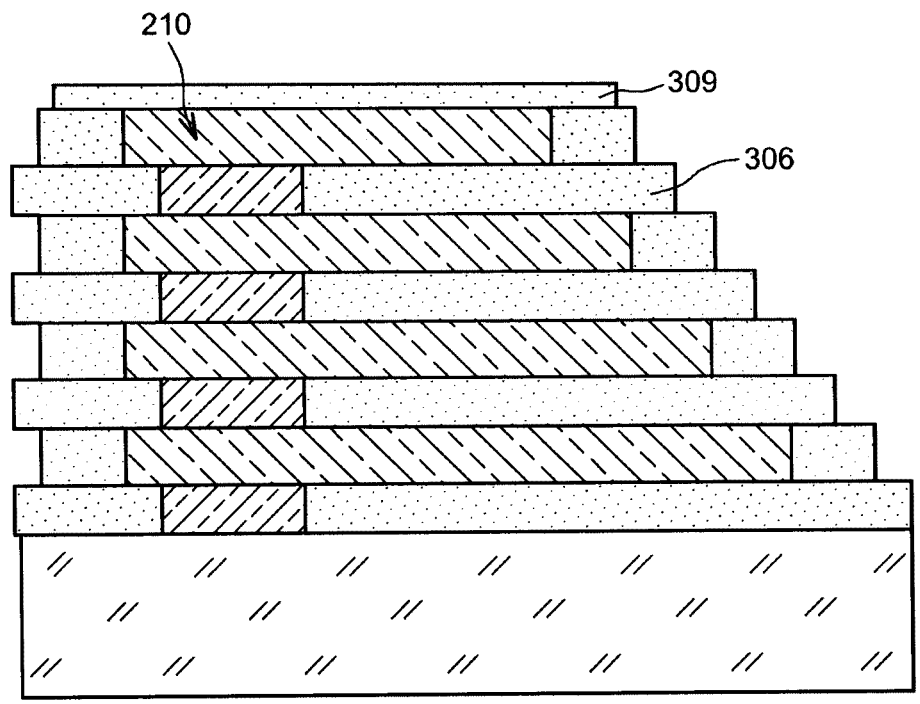
Figure 11B:
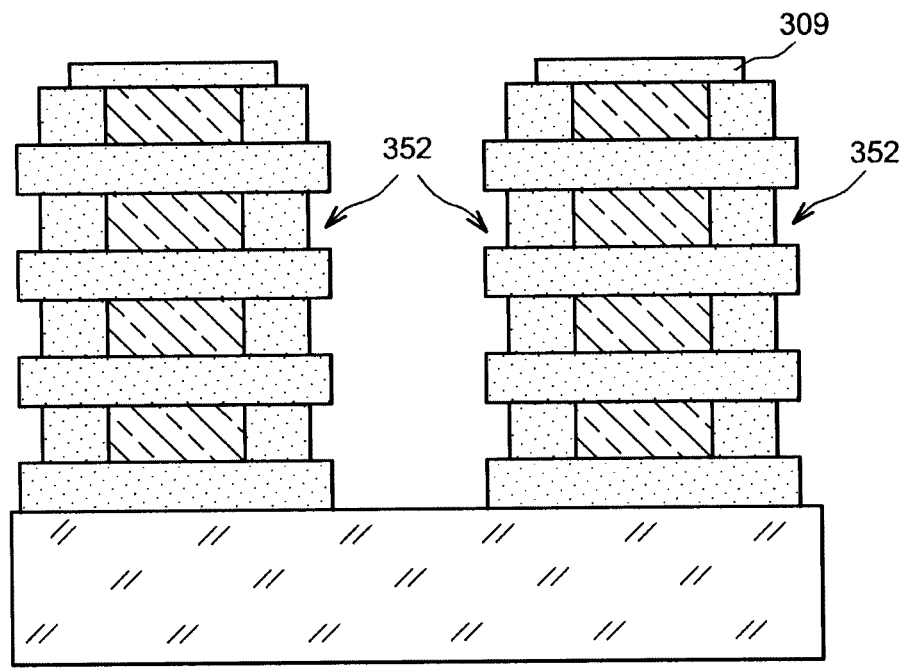
Figure 11C:
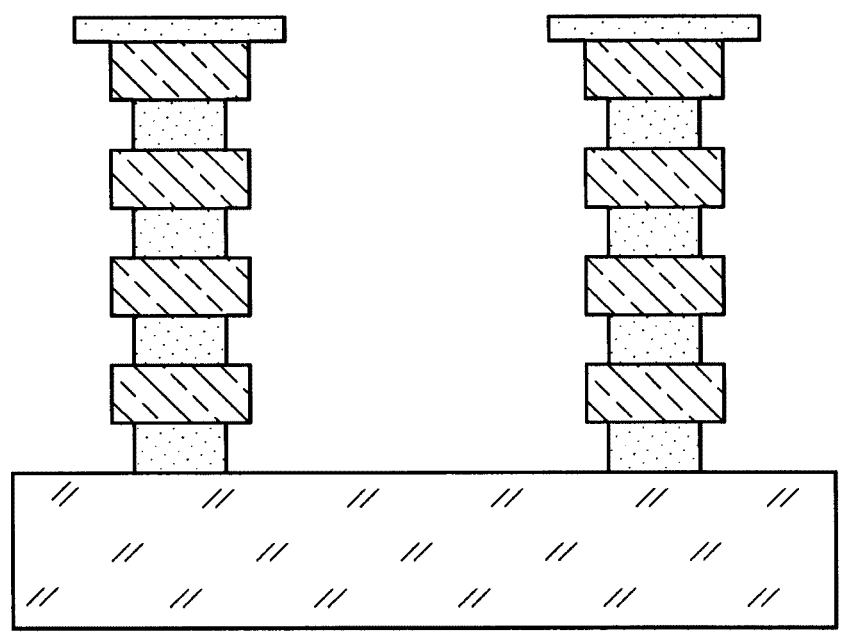

Following this oxidation, the layers $304_1, \ldots, 304_7$ are separated from one another by silicon oxide 306 (FIGS. 10B and 11B, the same stack being shown in these figures, respectively, according a plan view, according to a transversal sectional view A'A and according to a transversal sectional view B'B indicated in FIG. 9A).

Fixing the dimensions in directions parallel to the plane of the substrate of the block 210 such that they are greater than the smallest dimension in directions parallel to the plane of the substrate of each of the blocks 215 and $220a, \ldots, 220f$ retains a semi-conductor stack at the level of the first block 210 to ensure electrical continuity between the layers $304_1, \ldots, 304_7$ at the level of this block.

Next, the dielectrical material 306 is partially removed so as to expose the flanks of the layers $304_0, \ldots, 304_7$ at the level of the blocks $220a, \ldots, 220f$. The removal can be done by partial deoxidising, for example based on hydrofluoric acid HF.

Next, a stack of layers 352, 354, 356 is formed, comprising at least one layer of gate dielectrical 352, for example based on an oxide tunnel, such as for example $SiO_2$ of a thickness for example between 0.5 nanometers and 10 nanometers.

The stack of layers 352, 354, 356 comprises at least one electron-storage layer 354, formed from material such as dielectrical and according to a thickness favouring load storage. The charge storage layer 354 can be for example based on $Si_xN_y$, or another dielectrical material comprising similar trapping properties. The charge storage zone can also be formed by semi-conductors or metallic islets encapsulated in a dielectrical matrix, such as islets of Si, Ge, SiGe, Pt, W, Co, Ni, Au in a matrix of $Si_xO_y$, $Si_xN_y$. The electron-storage layer 354 can have a thickness of, for example, between 1 nanometer and 15 nanometers.

The stack of layers 352, 354, 356 also comprises at least one layer of dielectrical 356, for example based on oxide, such as for example $SiO_2$ of a thickness for example between 3 nanometers and 20 nanometers.

Figure 10C:
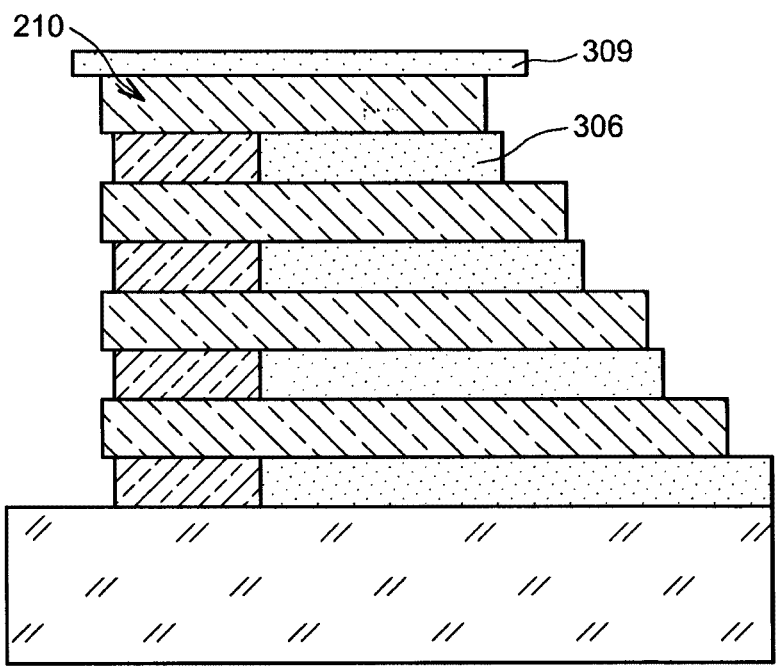
Figure 10D:
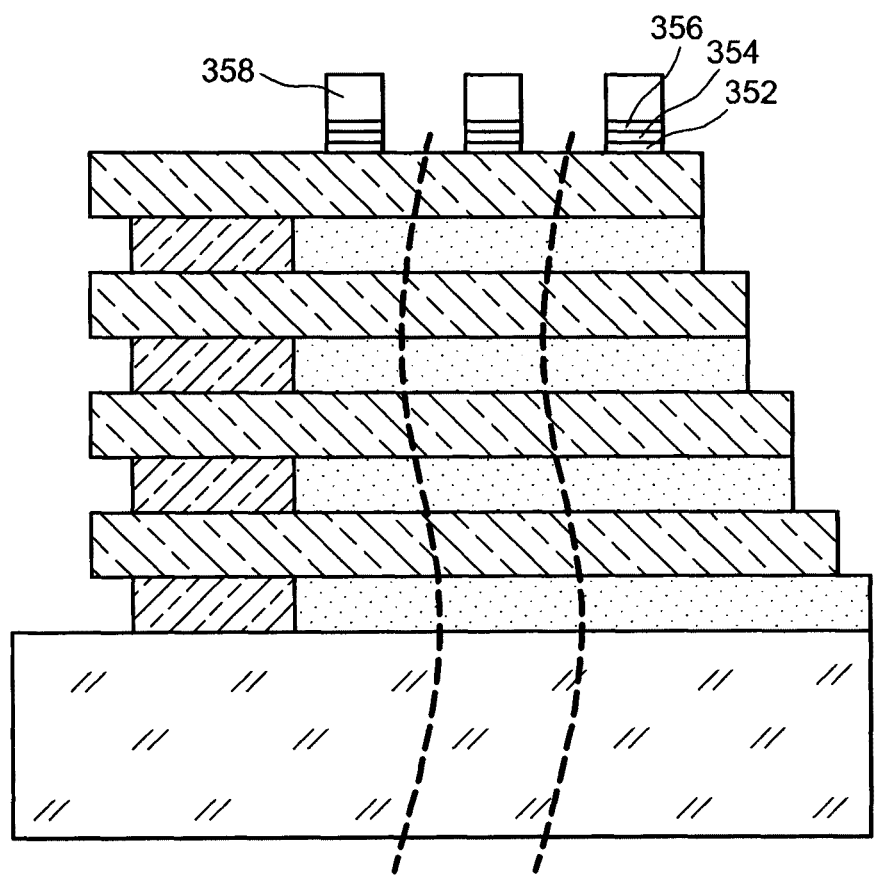

Next, gate material 358 is deposited, for example based on polysilicon, TiN, W, polysilicon silicide, TaN, Pt, PtSi or a combination of these materials, then chemical mechanical planarisation (CMP) of the gate material 358. Etching of the material gate 358 and of the stack of layers 352, 354, 356 is then carried out to form gates (FIGS. 10D and 11D, the same stack 202 being shown in these figures via a transversal sectional view A'A indicated in FIG. 9A, and via a transversal sectional view B'B).

Figure 12A:
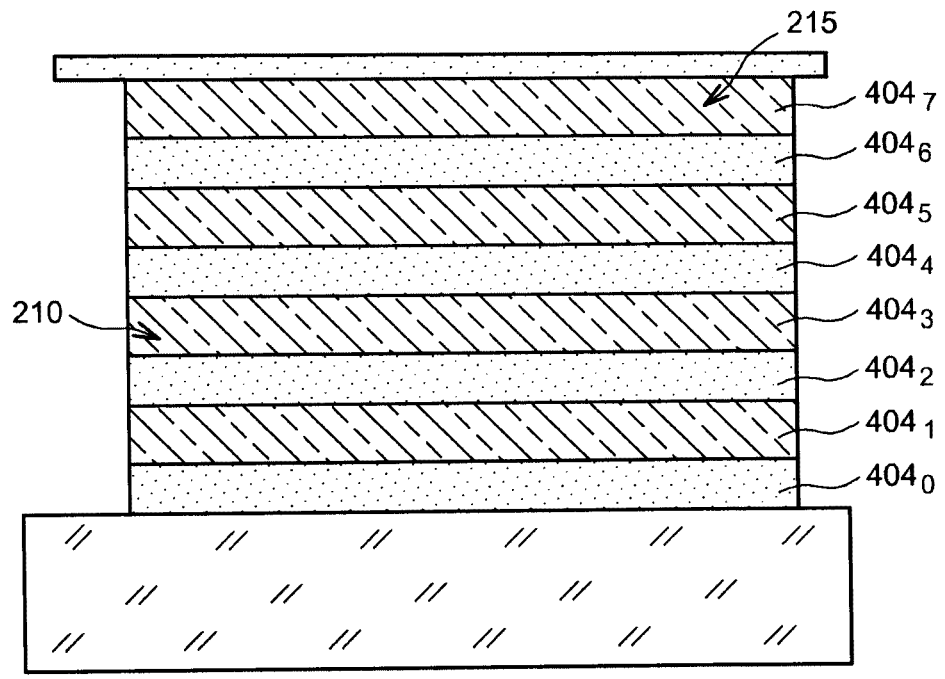
Figure 13A:
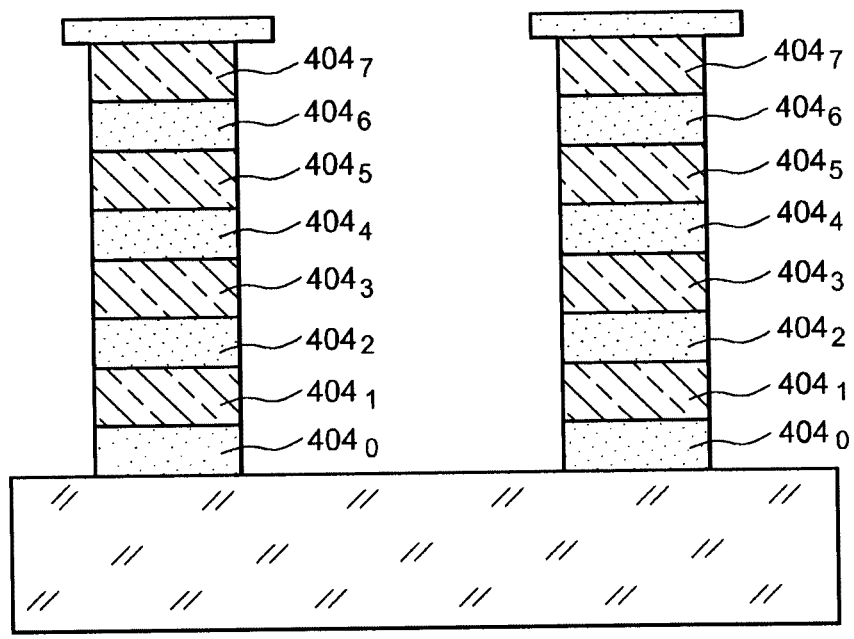

According to a variant of the example of a process which has just been described, the first block 210, the second block 215, and the blocks 220a, 220b, 220c, 220d, 220e, can be formed from a stack of layers $404_1$, $404_2$, $404_3$, $404_4$, $404_5$, $404_6$, $404_7$ and $404_8$ formed by alternating insulating layers $404_1$, $404_3$, $404_5$, $404_7$, and of layers $404_2$, $404_4$, $404_6$ and $404_8$ based on semi-conductor material (FIGS. 12A and 13A).

Such a stack can be formed for example as described in the document "direct wafer bonding and thinning down a generic technology to perform new structures", conference ECS 2005.

Such a stack can be made for example by means of a process of "smart cut" type for transferring a semi-conductor layer, for example based on silicon crystalline on an insulating layer, for example based on silicon oxide. A stack formed by alternating layers of silicon of thickness for example between 15 nanometers and 100 nanometers and insulating layers between 15 nanometers and 100 nanometers can be formed in this way.

Figure 12B:
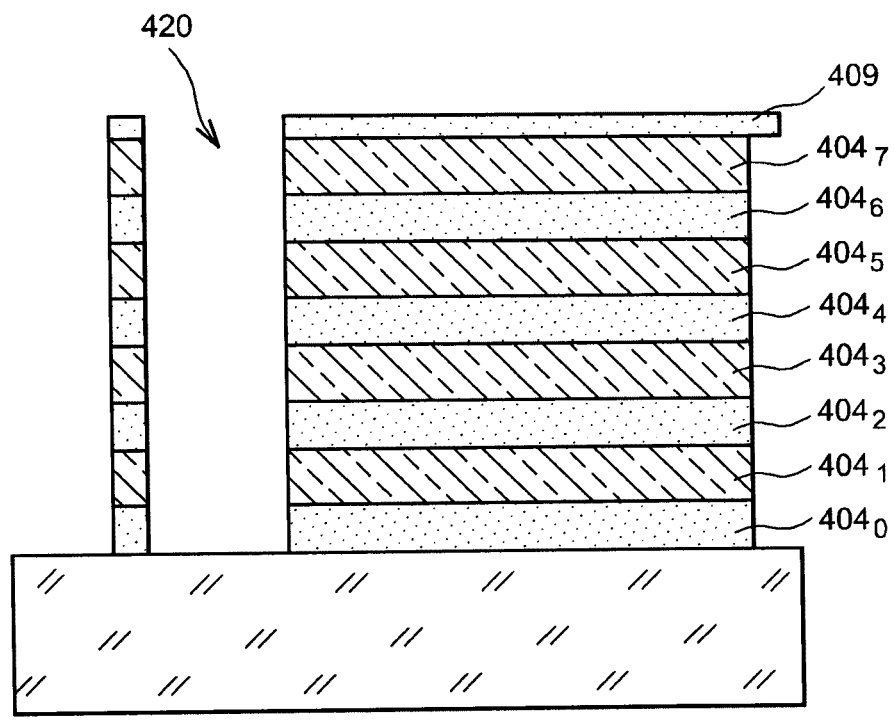

With such a stack, making a common source region can be done, for example, by making a hole 420 in the stack, by protecting the latter by means of masking 409 comprising an opening 411 at the level of the first block 210 (FIG. 12B).

Figure 12C:
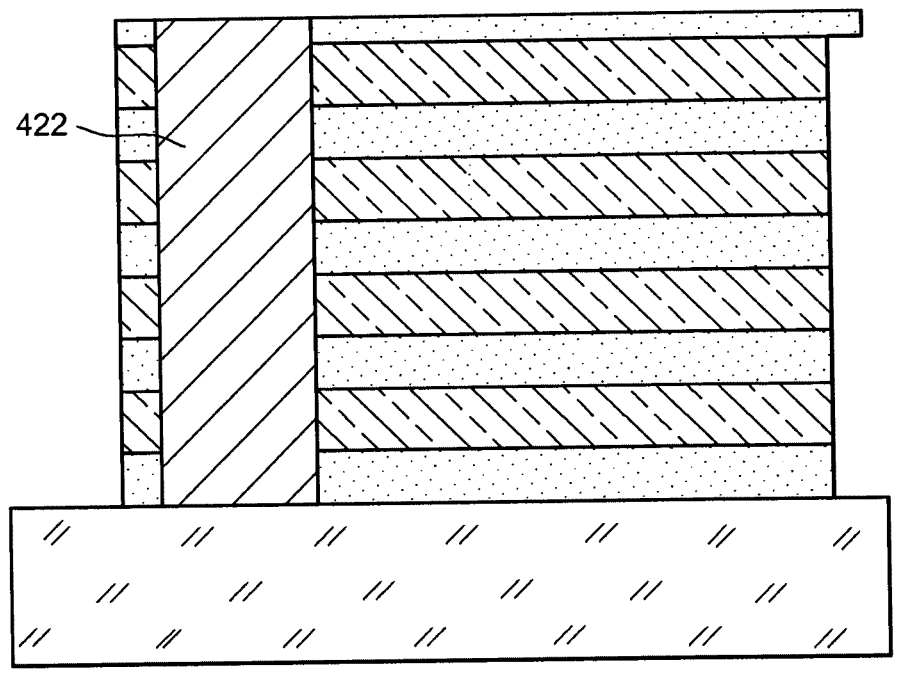

The hole 420 can then be filled by means of material 422, for example based on tungsten (FIG. 12C).

A stepped profile can be made in the stack of layers $404_1$, $404_2$, $404_3$, $404_4$, $404_5$, $404_6$, $404_7$ and $404_8$. Such a profile can be made for example as indicated previously in the example of a process described in conjunction with FIGS. 6, 7 and 8.

Figure 14:
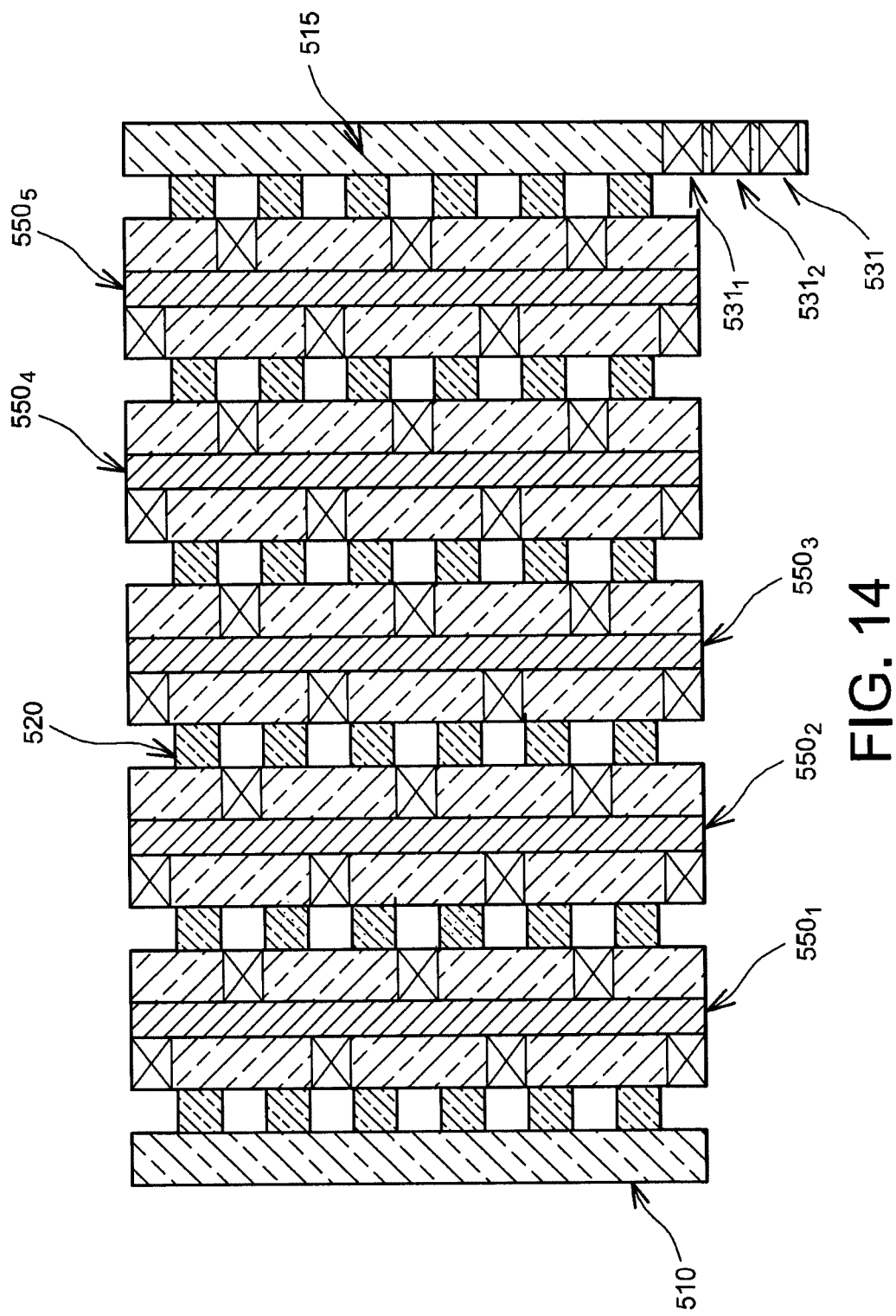

Another example of a flash memory device with particular addressing of gates is illustrated in FIG. 14.

In this device, each cell memory codes two bits, the transistors of the cell being double-gate.

Such a device comprises a plurality of memory cells C made in a stack of semi-conductor layers. The etched stack comprises at least one first block 510 in which a common source region of said transistors is formed. The etched stack also comprises a second block 515, as well as a plurality of other distinct juxtaposed blocks 520, connecting the first block 510 and the second block 515, said other distinct blocks comprising a number N, for example such as N=3 transistor channels, distinct and parallel to each other (and parallel to the plane of the figure). The device also comprises a plurality of gates, and in particular of double gates $550_1$, $550_2$, $550_3$, $550_4$, $550_5$. The memory matrix comprises 3 superposed levels of channels, each level being connected to a bit line (not shown) by way of contacts $531_1$, $531_2$, $531_3$.

Figure 15:
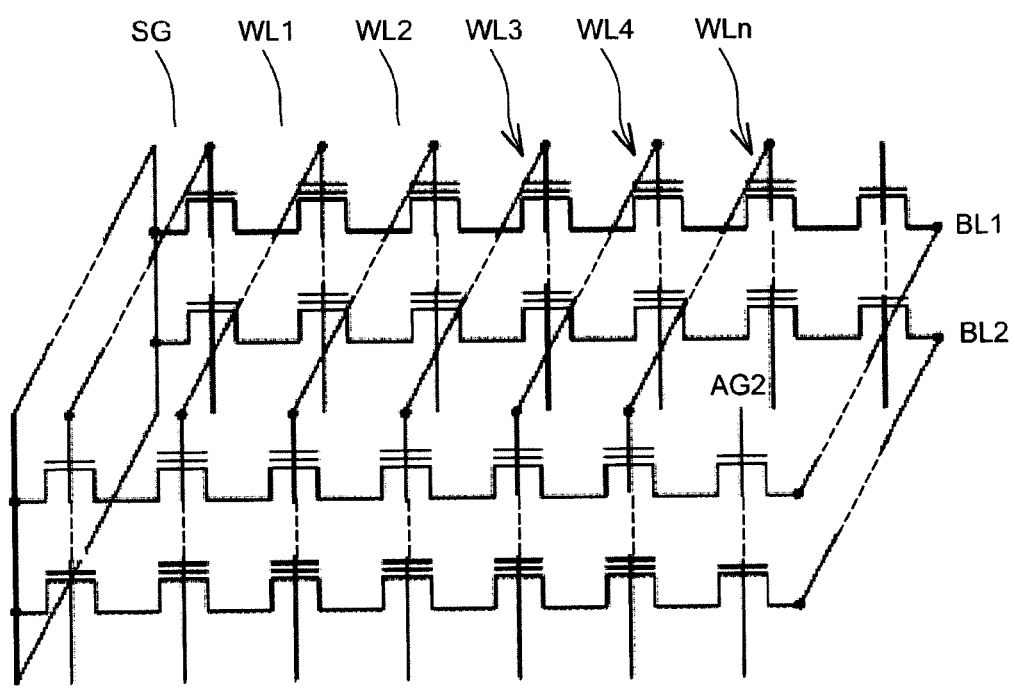

An electrical diagram equivalent to an example of a memory according to the invention is given in FIG. 15.

In this example, the memory comprises n word lines connected respectively to n control gates of the matrix.

The matrix also comprises p bit lines $BL_1$, $BL_2$, $BL_p$ connected respectively to the transistor drains of the same horizontal row of the matrix.

The device also comprises a first selection gate SG connected to m*p transistors of the matrix, as well as m second selection gates, again known as access gates AG1, AGm, the access gates AG1, AGm being respectively shared by the transistors of the same vertical row of the matrix.

A common source on transistors of the matrix is also provided.

An example of an operating and addressing principle of such a memory matrix, in terms of programming, erasing and reading, will now be given:

A. Programming Phase:

The aim is to program for example a target cell located at the first level of the matrix at the intersection between a word line $WL_2$ and a bit line $BL_1$.

For this, potential $V=V_{HIGH}$, for example equal to 18 volts on the word line $WL_2$, is applied to create an adequate electrical field in the cell so that the electrons of its channel pass through the first dielectrical layer, for example an oxide tunnel, to charge the electron-storage zone.

In this programming phase, the other word lines WL of the matrix are set at potential $V_{PASS}$, for example equal to 10 volts. So, the transistors of the cells are pass band. However, $V_{PASS}$ must be sufficiently weak to prevent parasite programming of these cells.

The earthed source is placed by applying for example potential V(SL)=0 V to a line of source.

A first gate of the transistor, called earthed selection gate, is placed. The access transistor located to the side of the line of source is blocked.

The access transistor of the second gate access of the transistor to be programmed at potential $V_{CC}$, for example of the order of 3 volts, is made pass band. The access transistors of the access gates of the other levels are blocked. The potential of the cells of the bit line $BL_1$ is earthed, all transistors connected to this line being pass band.

The transistors of the access gates of the non-programmed bit lines BL are at $V_{CC}$ so that no current can pass through. So, the bit lines BL of the non-programmed cells are blocked, and the potential of the corresponding channels grows by capacitive coupling. There is therefore no electrical field in the channel sufficient for the cell memory to be programmed. The cells connected to the same bit line of the same level are not programmed because their gates are polarised to too weak voltages. The cells connected to the same word line WL and belonging to the same level are not programmed because the bit lines of this level are at potential $V_{CC}$.

The cells connected to the same bit line BL and to the same word line WL are not programmed to the extent where the corresponding access transistors are blocked.

The target cell is programmed because its bit line BL is earthed, its access transistor is pass band, its word line WL is polarised to the programming voltage, and the cells of its same bit line BL are all pass band.

B. Erasing Phase:

Erasing can be done per sector as in a conventional memory matrix by electrically connecting the common source to a contact body.

C. Reading Phase:

The target cell is now to be read. It can be read as in a conventional Flash NAND memory. The memory plane relative to the other is selected by blocking the access gates of the non-selected memory planes.

The invention claimed is:

1. A memory device, comprising:
    a substrate;
    a plurality of memory cells comprising transistors arranged in a stack of layers based on said substrate, including a plurality of semi-conductor layers, the stack of layers comprising at least one first block of a common source of said transistors, and at least one second block on which a plurality of bit lines are arranged parallel to the principal plane of the substrate;

a plurality of other blocks, distinct and juxtaposed from the at least one first block and the at least one second block, electrically connecting the at least one first block and the at least one second block, said plurality of other blocks comprising, in a direction orthogonal to the principal plane of the substrate, a plurality of transistor channels that are distinct and parallel to each other and to the principal plane of the substrate, said plurality of transistor channels being distributed according to a matricial arrangement of horizontal rows and vertical rows of channels; and a plurality of gates formed by at least one gate material, including:

a first selection gate coating a first portion of all of said plurality of transistor channels in the matricial arrangement, a plurality of control gates coating second portions of all of said plurality of transistor channels in the matricial arrangement and being separated from the first portion, each of the second portions also being separated from each other, and a plurality of second selection gates, each second selection gate of the plurality coating only a single vertical row of channels in the matricial arrangement and being separated from other second selection gates of the plurality that are respectively coating different vertical rows of the channels, the plurality of second selection gates also being separated from the first portion and from the second portions, wherein at least one or more of said first selection gate, plurality of control gates, and plurality of second selection gates is based on a superposition of layers comprising at least one first layer of dielectrical material, at least one charge storage zone, and at least one second layer of dielectrical material.

2. The memory device as claimed in claim 1, in which the stack of layers is formed by alternating layers based on semi-conductor material doped according to a first dose with layers based on non-doped semi-conductor material or semi-conductor material doped according to a second dose different from the first dose.

3. The memory device as claimed in claim 1, in which said stack of layers is formed by alternating layers based on semi-conductor material with layers based on insulating material, said plurality of transistor channels being formed in said semi-conductor material.

4. The memory device as claimed in claim 1, said stack of layers being formed by alternating layers based on a first semi-conductor material with layers based on a second semi-conductor material different from the first semiconductor material, said plurality of transistor channels being formed in said first semi-conductor material.

5. The memory device as claimed in claim 1, said at least one charge storage zone being based on dielectrical material such as $Si_xN_y$, x and y being integers, or being at least one layer of dielectrical material comprising semi-conductor or conductor islets.

6. The memory device as claimed in claim 1,
wherein the plurality of bit lines are connected to respective drains of transistors of which channels belong to a same horizontal row of the matricial arrangement.

* * * * *